US012742874B2

(12) United States Patent
Peng et al.

(10) Patent No.: US 12,742,874 B2
(45) Date of Patent: Sep. 22, 2026

(54) ESTIMATING UE ORIENTATION BASED ON ANTENNA PHASE CENTER (APC) INFORMATION

(71) Applicant: QUALCOMM Incorporated, San Diego, CA (US)

(72) Inventors: Yuxiang Peng, Sunnyvale, CA (US); Ning Luo, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 400 days.

(21) Appl. No.: 18/521,824

(22) Filed: Nov. 28, 2023

(65) Prior Publication Data

US 2025/0172684 A1 May 29, 2025

(51) Int. Cl.

| | |
|---|---|
| ***H04L 1/00*** | (2006.01) |
| ***G01R 29/10*** | (2006.01) |
| ***G01S 13/74*** | (2006.01) |
| ***G01S 19/46*** | (2010.01) |
| ***H04W 64/00*** | (2009.01) |

(52) U.S. Cl.
CPC .............. *G01S 13/74* (2013.01); *G01R 29/10* (2013.01); *G01S 19/46* (2013.01); *H04W 64/00* (2013.01)

(58) Field of Classification Search
CPC .......... G01S 13/74; G01S 19/46; G01S 19/32; G01S 19/235; G01S 19/54; G01S 7/006; G01S 13/765; G01R 29/10; H04W 64/00
USPC ....................................................... 455/456.1
See application file for complete search history.

(56) References Cited

U.S. PATENT DOCUMENTS

2014/0206389 A1* 7/2014 Aldana ................. H04W 4/029 455/456.2
2020/0333468 A1* 10/2020 Liu ......................... G01S 19/14
2022/0163677 A1* 5/2022 Muthuraman ........ G01S 19/235

* cited by examiner

*Primary Examiner* — Tanmay K Shah
(74) *Attorney, Agent, or Firm* — Thien T. Nguyen

(57) ABSTRACT

The apparatus may be a wireless device or wireless device component configured to obtain APC information for a plurality of frequencies associated with an antenna of the wireless device and measure a set of PS at each of the plurality of frequencies via the antenna. The apparatus may further be configured to identify a location and an orientation of the wireless device based on the APC information and the set of PS, and output an indication of the location and the orientation of the wireless device.

26 Claims, 12 Drawing Sheets

One Frame (TDD)
10 ms
subframe
slot
RB
200
OFDM symbol
subcarrier
DMRS R
CSI-RS

230
PDCCH CORESET
SSS
PSS
PDSCH
PBCH
REG
12 REs
1 CCE = 6 REGs
SS/PBCH Block
BWP
20 RBs
channel bandwidth RBs 250
SRS
SRS Comb 0
SRS Comb 1

280
PUCCH
PUSCH 500
510
L1 APC
511
L5 APC
515
L2 APC
512
$D_{1/5}$
$D_{1/2}$
$D_{2/5}$
530
L1/L5 APC
531
L2 APC
532
550
560
L1 APC
551
L2 APC
552
L5 APC
555

ESTIMATING UE ORIENTATION BASED ON ANTENNA PHASE CENTER (APC) INFORMATION

TECHNICAL FIELD

The present disclosure relates generally to communication systems, and more particularly, to orientation determination for a wireless device.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects. This summary neither identifies key or critical elements of all aspects nor delineates the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a wireless device configured to obtain antenna phase center (APC) information for a plurality of frequencies associated with an antenna of the wireless device and measure a set of positioning signals (PS) at each of the plurality of frequencies via the antenna. The apparatus may further be configured to identify a location and an orientation of the wireless device based on the APC information and the set of PS, and output an indication of the location and the orientation of the wireless device.

To the accomplishment of the foregoing and related ends, the one or more aspects may include the features hereinafter fully described and particularly pointed out in the claims. The following description and the drawings set forth in detail certain illustrative features of the one or more aspects. These features are indicative, however, of but a few of the various ways in which the principles of various aspects may be employed.

DETAILED DESCRIPTION

Figure 1:
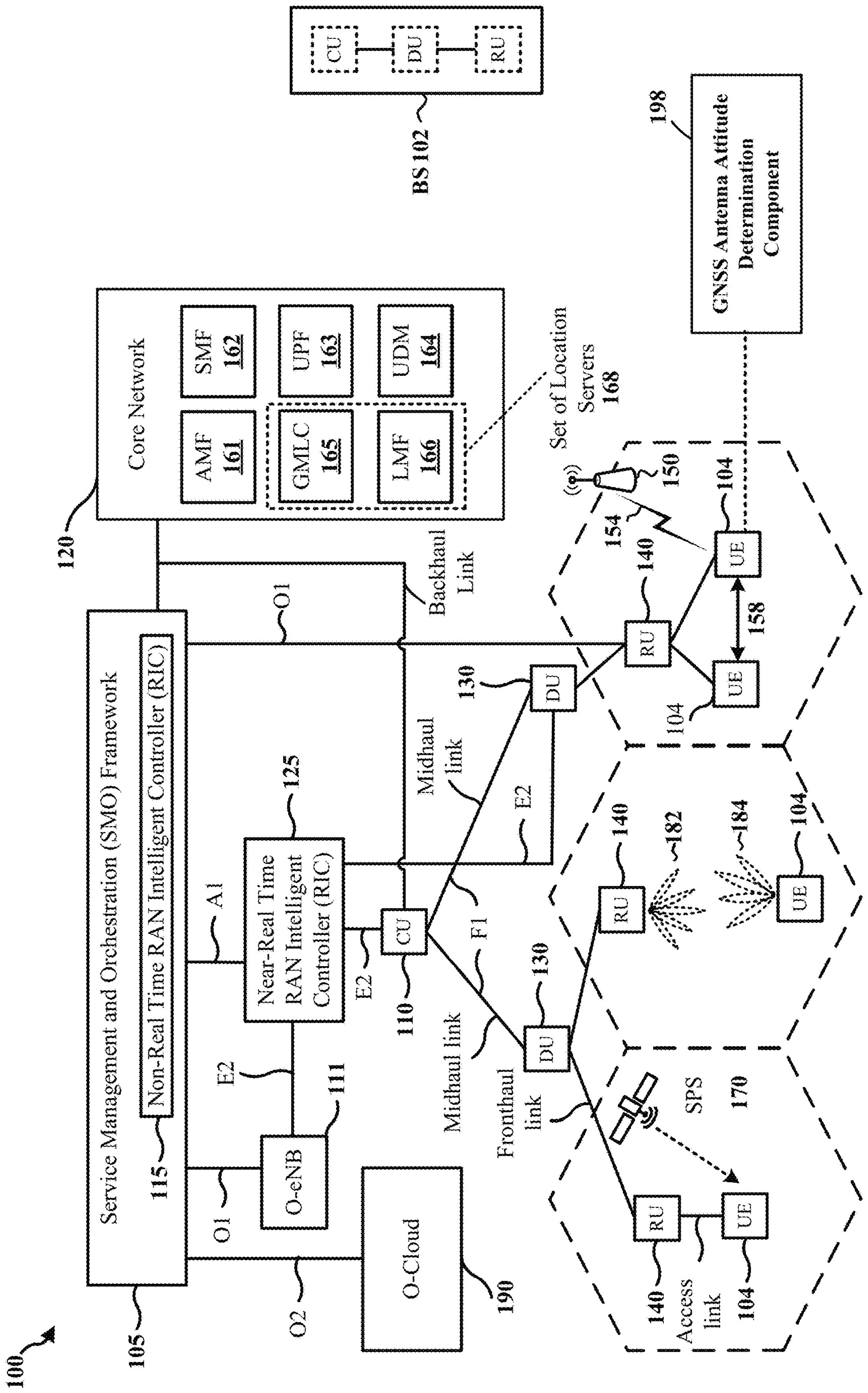
FIG. 1 is a diagram illustrating an example of a wireless communications system and an access network.

In some aspects, it may be important to determine an attitude (or orientation) of a UE (e.g., a wireless device such as a smartphone or a vehicle) for modern location systems.

In a static start scenario, heading (or attitude) estimation may be an issue in many existing market location products. Some solutions to attitude and/or heading estimation may use multiple global navigation satellite system (GNSS) antennas with known relative geometry.

In some aspects of multi-frequency GNSS receiver systems, the antenna phase center offset (PCO) between antennas associated with multiple frequency bands may not be negligible in precise positioning applications. For example, the GNSS antenna offset between an L1 phase center and an L5 phase center may be 1-10 cm (e.g., approximately 4 or 5 cm). Issues arising from the PCO between antennas associated with multiple frequency bands (e.g., PCO-based issues) may exist for nearly all GNSS antennas, where each GNSS antenna may experience the PCO-based issues with different magnitudes. For example, larger PCOs, in some aspects, may appear more often in lower cost GNSS antennas (e.g., handset or automotive grade GNSS antennas).

Various aspects relate generally to attitude (or orientation) determination at a wireless device and more particularly attitude determination at a wireless device using a multi-frequency GNSS antenna (also referred herein as an antenna assembly or antenna structure). Some aspects more specifically relate to PCO-based attitude determination. In some examples, a wireless device may be configured to obtain APC (or PCO) information for a plurality of frequencies associated with an antenna (referred herein as an antenna assembly or antenna structure) of the wireless device and measure a set of PS at each of the plurality of frequencies via the antenna. The wireless device, in some examples, may further be configured to identify a location and an orientation of the wireless device based on the APC information and the set of PS, and output an indication of the location and the orientation of the wireless device.

Particular aspects of the subject matter described in this disclosure can be implemented to realize one or more of the following potential advantages. In some examples, by using PCO information, the described techniques can be used to provide a more accurate attitude (e.g., a heading or orientation) determination. Furthermore, in some aspects, by using the PCO information, the attitude determination may be made based on measurements associated with a single multi-frequency antenna.

The detailed description set forth below in connection with the drawings describes various configurations and does not represent the only configurations in which the concepts described herein may be practiced. The detailed description includes specific details for the purpose of providing a thorough understanding of various concepts. However, these concepts may be practiced without these specific details. In some instances, well known structures and components are shown in block diagram form in order to avoid obscuring such concepts.

Several aspects of telecommunication systems are presented with reference to various apparatus and methods. These apparatus and methods are described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. When multiple processors are implemented, the multiple processors may perform the functions individually or in combination. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software, whether referred to as software, firmware, middleware, microcode, hardware description language, or otherwise, shall be construed broadly to mean instructions, instruction sets, code, code segments, program code, programs, subprograms, software components, applications, software applications, software packages, routines, subroutines, objects, executables, threads of execution, procedures, functions, or any combination thereof.

Accordingly, in one or more example aspects, implementations, and/or use cases, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, such computer-readable media can include a random-access memory (RAM), a read-only memory (ROM), an electrically erasable programmable ROM (EEPROM), optical disk storage, magnetic disk storage, other magnetic storage devices, combinations of the types of computer-readable media, or any other medium that can be used to store computer executable code in the form of instructions or data structures that can be accessed by a computer.

While aspects, implementations, and/or use cases are described in this application by illustration to some examples, additional or different aspects, implementations and/or use cases may come about in many different arrangements and scenarios. Aspects, implementations, and/or use cases described herein may be implemented across many differing platform types, devices, systems, shapes, sizes, and packaging arrangements. For example, aspects, implementations, and/or use cases may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described examples may occur. Aspects, implementations, and/or use cases may range a spectrum from chip-level or modular components to non-modular, non-chip-level implementations and further to aggregate, distributed, or original equipment manufacturer (OEM) devices or systems incorporating one or more techniques herein. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor (s), interleaver, adders/summers, etc.). Techniques described herein may be practiced in a wide variety of devices, chip-level components, systems, distributed arrangements, aggregated or disaggregated components, end-user devices, etc. of varying sizes, shapes, and constitution.

Deployment of communication systems, such as 5G NR systems, may be arranged in multiple manners with various components or constituent parts. In a 5G NR system, or network, a network node, a network entity, a mobility element of a network, a radio access network (RAN) node, a core network node, a network element, or a network equipment, such as a base station (BS), or one or more units (or one or more components) performing base station functionality, may be implemented in an aggregated or disaggregated architecture. For example, a BS (such as a Node B (NB), evolved NB (eNB), NR BS, 5G NB, access point (AP), a transmission reception point (TRP), or a cell, etc.) may be implemented as an aggregated base station (also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (such as one or more central or centralized units (CUs), one or more distributed units (DUs), or one or more radio units (RUs)). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU and RU can be implemented as virtual units, i.e., a virtual central unit (VCU), a virtual distributed unit (VDU), or a virtual radio unit (VRU).

Base station operation or network design may consider aggregation characteristics of base station functionality. For example, disaggregated base stations may be utilized in an integrated access backhaul (IAB) network, an open radio access network (O-RAN (such as the network configuration sponsored by the O-RAN Alliance)), or a virtualized radio access network (vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

FIG. 1 is a diagram 100 illustrating an example of a wireless communications system and an access network. The illustrated wireless communications system includes a disaggregated base station architecture. The disaggregated base station architecture may include one or more CUs 110 that can communicate directly with a core network 120 via a backhaul link, or indirectly with the core network 120 through one or more disaggregated base station units (such as a Near-Real Time (Near-RT) RAN Intelligent Controller (RIC) 125 via an E2 link, or a Non-Real Time (Non-RT) RIC 115 associated with a Service Management and Orchestration (SMO) Framework 105, or both). A CU 110 may communicate with one or more DUs 130 via respective midhaul links, such as an F1 interface. The DUs 130 may communicate with one or more RUs 140 via respective fronthaul links. The RUs 140 may communicate with respective UEs 104 via one or more radio frequency (RF) access links. In some implementations, the UE 104 may be simultaneously served by multiple RUs 140.

Each of the units, i.e., the CUS 110, the DUs 130, the RUs 140, as well as the Near-RT RICs 125, the Non-RT RICs 115, and the SMO Framework 105, may include one or more interfaces or be coupled to one or more interfaces configured to receive or to transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or to transmit signals over a wired transmission medium to one or more of the other units. Additionally, the units can include a wireless interface, which may include a receiver, a transmitter, or a transceiver (such as an RF transceiver), configured to receive or to transmit signals, or both, over a wireless transmission medium to one or more of the other units.

In some aspects, the CU 110 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 110. The CU 110 may be configured to handle user plane functionality (i.e., Central Unit-User Plane (CU-UP)), control plane functionality (i.e., Central Unit-Control Plane (CU-CP)), or a combination thereof. In some implementations, the CU 110 can be logically split into one or more CU-UP units and one or more CU-CP units. The CU-UP unit can communicate bidirectionally with the CU-CP unit via an interface, such as an E1 interface when implemented in an O-RAN configuration. The CU 110 can be implemented to communicate with the DU 130, as necessary, for network control and signaling.

The DU 130 may correspond to a logical unit that includes one or more base station functions to control the operation of one or more RUs 140. In some aspects, the DU 130 may host one or more of a radio link control (RLC) layer, a medium access control (MAC) layer, and one or more high physical (PHY) layers (such as modules for forward error correction (FEC) encoding and decoding, scrambling, modulation, demodulation, or the like) depending, at least in part, on a functional split, such as those defined by 3GPP. In some aspects, the DU 130 may further host one or more low PHY layers. Each layer (or module) can be implemented with an interface configured to communicate signals with other layers (and modules) hosted by the DU 130, or with the control functions hosted by the CU 110.

Lower-layer functionality can be implemented by one or more RUs 140. In some deployments, an RU 140, controlled by a DU 130, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 140 can be implemented to handle over the air (OTA) communication with one or more UEs 104. In some implementations, real-time and non-real-time aspects of control and user plane communication with the RU(s) 140 can be controlled by the corresponding DU 130. In some scenarios, this configuration can enable the DU(s) 130 and the CU 110 to be implemented in a cloud-based RAN architecture, such as a vRAN architecture.

The SMO Framework 105 may be configured to support RAN deployment and provisioning of non-virtualized and virtualized network elements. For non-virtualized network elements, the SMO Framework 105 may be configured to support the deployment of dedicated physical resources for RAN coverage requirements that may be managed via an operations and maintenance interface (such as an O1 interface). For virtualized network elements, the SMO Framework 105 may be configured to interact with a cloud computing platform (such as an open cloud (O-Cloud) 190) to perform network element life cycle management (such as to instantiate virtualized network elements) via a cloud computing platform interface (such as an O2 interface). Such virtualized network elements can include, but are not limited to, CUs 110, DUs 130, RUs 140 and Near-RT RICs 125. In some implementations, the SMO Framework 105 can communicate with a hardware aspect of a 4G RAN, such as an open eNB (O-eNB) 111, via an O1 interface. Additionally, in some implementations, the SMO Framework 105 can communicate directly with one or more RUs 140 via an O1 interface. The SMO Framework 105 also may include a Non-RT RIC 115 configured to support functionality of the SMO Framework 105.

The Non-RT RIC 115 may be configured to include a logical function that enables non-real-time control and optimization of RAN elements and resources, artificial intelligence (AI)/machine learning (ML) (AI/ML) workflows including model training and updates, or policy-based guidance of applications/features in the Near-RT RIC 125. The Non-RT RIC 115 may be coupled to or communicate with (such as via an A1 interface) the Near-RT RIC 125. The Near-RT RIC 125 may be configured to include a logical function that enables near-real-time control and optimization of RAN elements and resources via data collection and actions over an interface (such as via an E2 interface) connecting one or more CUs 110, one or more DUs 130, or both, as well as an O-eNB, with the Near-RT RIC 125.

In some implementations, to generate AI/ML models to be deployed in the Near-RT RIC 125, the Non-RT RIC 115 may receive parameters or external enrichment information from external servers. Such information may be utilized by the Near-RT RIC 125 and may be received at the SMO Framework 105 or the Non-RT RIC 115 from non-network data sources or from network functions. In some examples, the Non-RT RIC 115 or the Near-RT RIC 125 may be configured to tune RAN behavior or performance. For example, the Non-RT RIC 115 may monitor long-term trends and patterns for performance and employ AI/ML models to perform corrective actions through the SMO Framework 105 (such as reconfiguration via O1) or via creation of RAN management policies (such as A1 policies).

At least one of the CU 110, the DU 130, and the RU 140 may be referred to as a base station 102. Accordingly, a base station 102 may include one or more of the CU 110, the DU 130, and the RU 140 (each component indicated with dotted lines to signify that each component may or may not be included in the base station 102). The base station 102 provides an access point to the core network 120 for a UE 104. The base station 102 may include macrocells (high power cellular base station) and/or small cells (low power cellular base station). The small cells include femtocells, picocells, and microcells. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links between the RUs 140 and the UEs 104 may include uplink (UL) (also referred to as reverse link) transmissions from a UE 104 to an RU 140 and/or downlink (DL) (also referred to as forward link) transmissions from an RU 140 to a UE 104. The communication links may use multiple-input and multiple-output (MIMO) antenna technology, including spatial multiplexing, beamforming, and/or transmit diversity. The communication links may be through one or more carriers. The base station 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL wireless wide area network (WWAN) spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, Bluetooth™ (Bluetooth is a trademark of the Bluetooth Special Interest Group (SIG)), Wi-Fi™ (Wi-Fi is a trademark of the Wi-Fi Alliance) based on the Institute of Electrical and Electronics Engineers (IEEE) 802.11 standard, LTE, or NR.

The wireless communications system may further include a Wi-Fi AP 150 in communication with UEs 104 (also referred to as Wi-Fi stations (STAs)) via communication link 154, e.g., in a 5 GHz unlicensed frequency spectrum or the like. When communicating in an unlicensed frequency spectrum, the UEs 104/AP 150 may perform a clear channel assessment (CCA) prior to communicating in order to determine whether the channel is available.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a “sub-6 GHz” band in various documents and articles. A similar nomenclature issue sometimes occurs with regard to FR2, which is often referred to (interchangeably) as a “millimeter wave” band in documents and articles, despite being different from the extremely high frequency (EHF) band (30 GHz-300 GHz) which is identified by the International Telecommunications Union (ITU) as a “millimeter wave” band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR2-2 (52.6 GHz-71 GHz), FR4 (71 GHz-114.25 GHz), and FR5 (114.25 GHz-300 GHz). Each of these higher frequency bands falls within the EHF band.

With the above aspects in mind, unless specifically stated otherwise, the term "sub-6 GHz" or the like if used herein may broadly represent frequencies that may be less than 6 GHz, may be within FR1, or may include mid-band frequencies. Further, unless specifically stated otherwise, the term "millimeter wave" or the like if used herein may broadly represent frequencies that may include mid-band frequencies, may be within FR2, FR4, FR2-2, and/or FR5, or may be within the EHF band.

The base station 102 and the UE 104 may each include a plurality of antennas, such as antenna elements, antenna panels, and/or antenna arrays to facilitate beamforming. The base station 102 may transmit a beamformed signal 182 to the UE 104 in one or more transmit directions. The UE 104 may receive the beamformed signal from the base station 102 in one or more receive directions. The UE 104 may also transmit a beamformed signal 184 to the base station 102 in one or more transmit directions. The base station 102 may receive the beamformed signal from the UE 104 in one or more receive directions. The base station 102/UE 104 may perform beam training to determine the best receive and transmit directions for each of the base station 102/UE 104. The transmit and receive directions for the base station 102 may or may not be the same. The transmit and receive directions for the UE 104 may or may not be the same.

The base station 102 may include and/or be referred to as a gNB, Node B, eNB, an access point, a base transceiver station, a radio base station, a radio transceiver, a transceiver function, a basic service set (BSS), an extended service set (ESS), a TRP, network node, network entity, network equipment, or some other suitable terminology. The base station 102 can be implemented as an integrated access and backhaul (IAB) node, a relay node, a sidelink node, an aggregated (monolithic) base station with a baseband unit (BBU) (including a CU and a DU) and an RU, or as a disaggregated base station including one or more of a CU, a DU, and/or an RU. The set of base stations, which may include disaggregated base stations and/or aggregated base stations, may be referred to as next generation (NG) RAN (NG-RAN).

The core network 120 may include an Access and Mobility Management Function (AMF) 161, a Session Management Function (SMF) 162, a User Plane Function (UPF) 163, a Unified Data Management (UDM) 164, one or more location servers 168, and other functional entities. The AMF 161 is the control node that processes the signaling between the UEs 104 and the core network 120. The AMF 161 supports registration management, connection management, mobility management, and other functions. The SMF 162 supports session management and other functions. The UPF 163 supports packet routing, packet forwarding, and other functions. The UDM 164 supports the generation of authentication and key agreement (AKA) credentials, user identification handling, access authorization, and subscription management. The one or more location servers 168 are illustrated as including a Gateway Mobile Location Center (GMLC) 165 and a Location Management Function (LMF) 166. However, generally, the one or more location servers 168 may include one or more location/positioning servers, which may include one or more of the GMLC 165, the LMF 166, a position determination entity (PDE), a serving mobile location center (SMLC), a mobile positioning center (MPC), or the like. The GMLC 165 and the LMF 166 support UE location services. The GMLC 165 provides an interface for clients/applications (e.g., emergency services) for accessing UE positioning information. The LMF 166 receives measurements and assistance information from the NG-RAN and the UE 104 via the AMF 161 to compute the position of the UE 104. The NG-RAN may utilize one or more positioning methods in order to determine the position of the UE 104. Positioning the UE 104 may involve signal measurements, a position estimate, and an optional velocity computation based on the measurements. The signal measurements may be made by the UE 104 and/or the base station 102 serving the UE 104. The signals measured may be based on one or more of a satellite positioning system (SPS) 170 (e.g., one or more of a Global Navigation Satellite System (GNSS), global position system (GPS), non-terrestrial network (NTN), or other satellite position/location system), LTE signals, wireless local area network (WLAN) signals, Bluetooth signals, a terrestrial beacon system (TBS), sensor-based information (e.g., barometric pressure sensor, motion sensor), NR enhanced cell ID (NR E-CID) methods, NR signals (e.g., multi-round trip time (Multi-RTT), DL angle-of-departure (DL-AoD), DL time difference of arrival (DL-TDOA), UL time difference of arrival (UL-TDOA), and UL angle-of-arrival (UL-AoA) positioning), and/or other systems/signals/sensors.

Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in certain aspects, the UE 104 may have a GNSS antenna attitude determination (GAAD) component 198 that may be configured to obtain APC information for a plurality of frequencies associated with an antenna (also called an antenna assembly or antenna structure) of the wireless device and measure a set of PS at each of the plurality of frequencies via the antenna. The apparatus may further be configured to identify a location and an orientation of the wireless device based on the APC information and the set of PS, and output an indication of the location and the orientation of the wireless device. Although the following description may be focused on 5G NR, the concepts described herein may be applicable to other similar areas, such as LTE, LTE-A, CDMA, GSM, and other wireless technologies.

Figure 2A:
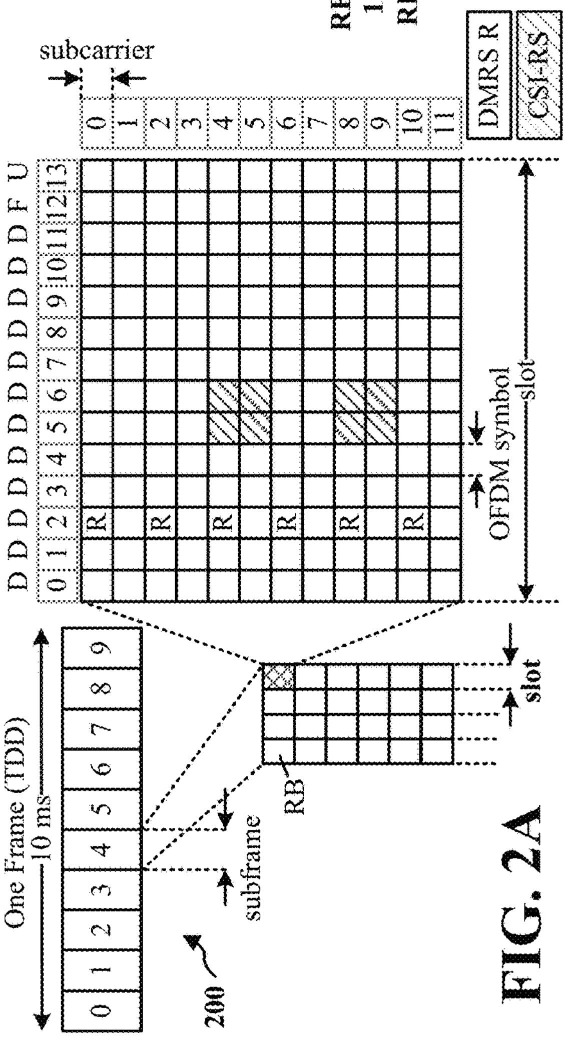
FIG. 2A is a diagram illustrating an example of a first frame, in accordance with various aspects of the present disclosure.
Figure 2B:
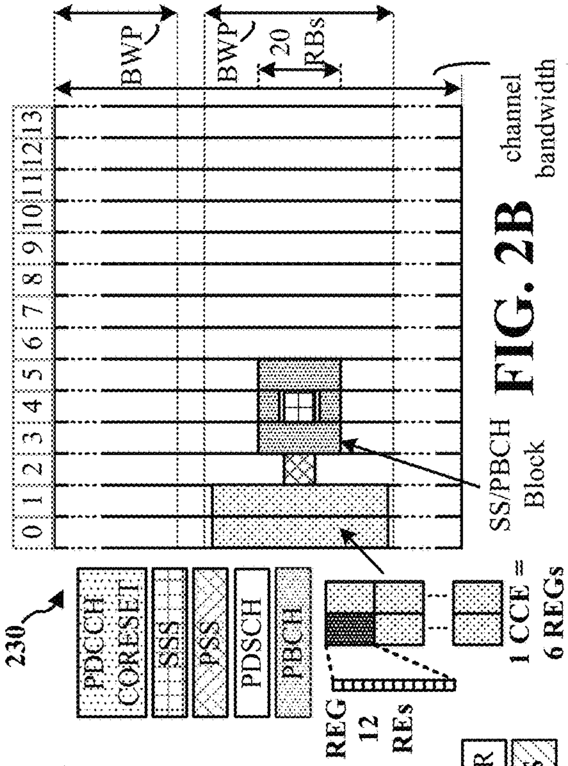
FIG. 2B is a diagram illustrating an example of downlink (DL) channels within a subframe, in accordance with various aspects of the present disclosure.
Figure 2C:
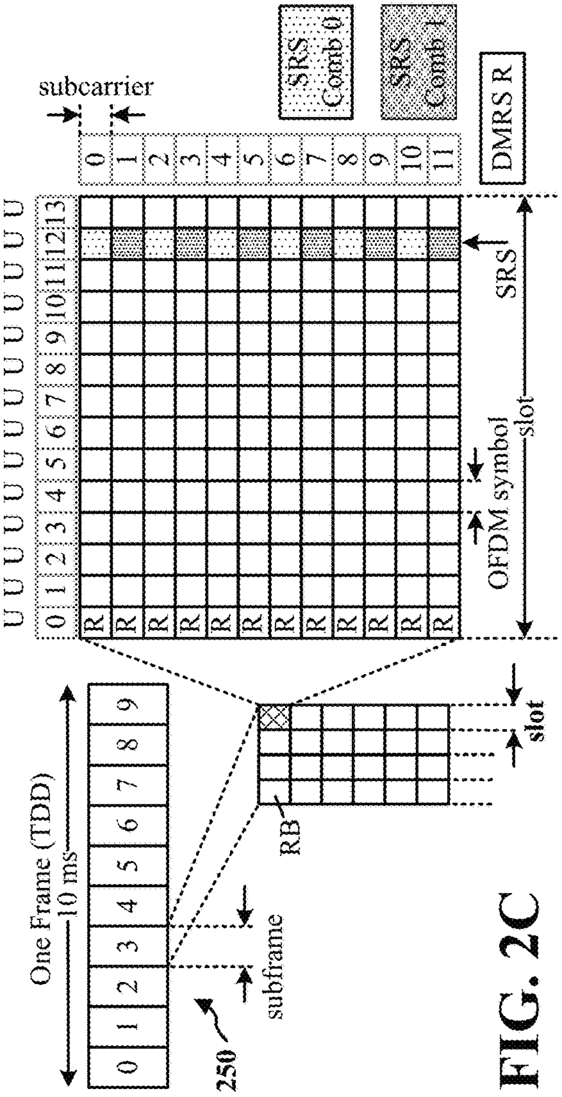
FIG. 2C is a diagram illustrating an example of a second frame, in accordance with various aspects of the present disclosure.
Figure 2D:
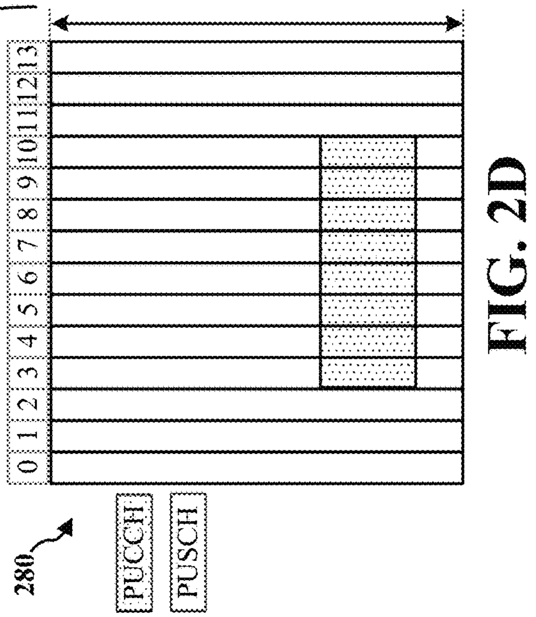
FIG. 2D is a diagram illustrating an example of uplink (UL) channels within a subframe, in accordance with various aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (for power limited scenarios; limited to a single stream transmission). The number of slots within a subframe is based on the CP and the numerology. The numerology defines the subcarrier spacing (SCS) (see Table 1). The symbol length/duration may scale with 1/SCS.

TABLE 1

Numerology, SCS, and CP

| $\mu$ | SCS $\Delta f = 2^{\mu} \cdot 15$[kHz] | Cyclic prefix |
|---|---|---|
| 0 | 15 | Normal |
| 1 | 30 | Normal |
| 2 | 60 | Normal, Extended |
| 3 | 120 | Normal |
| 4 | 240 | Normal |
| 5 | 480 | Normal |
| 6 | 960 | Normal |

For normal CP (14 symbols/slot), different numerologies $\mu$ 0 to 4 allow for 1, 2, 4, 8, and 16 slots, respectively, per subframe. For extended CP, the numerology 2 allows for 4 slots per subframe. Accordingly, for normal CP and numerology $\mu$, there are 14 symbols/slot and $2^{\mu}$ slots/subframe. The subcarrier spacing may be equal to $2^{\mu}*15$ kHz, where $\mu$ is the numerology 0 to 4. As such, the numerology $\mu=0$ has a subcarrier spacing of 15 kHz and the numerology $\mu=4$ has a subcarrier spacing of 240 kHz. The symbol length/duration is inversely related to the subcarrier spacing. FIGS. 2A-2D provide an example of normal CP with 14 symbols per slot and numerology $\mu=2$ with 4 slots per subframe. The slot duration is 0.25 ms, the subcarrier spacing is 60 kHz, and the symbol duration is approximately 16.67 μs. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
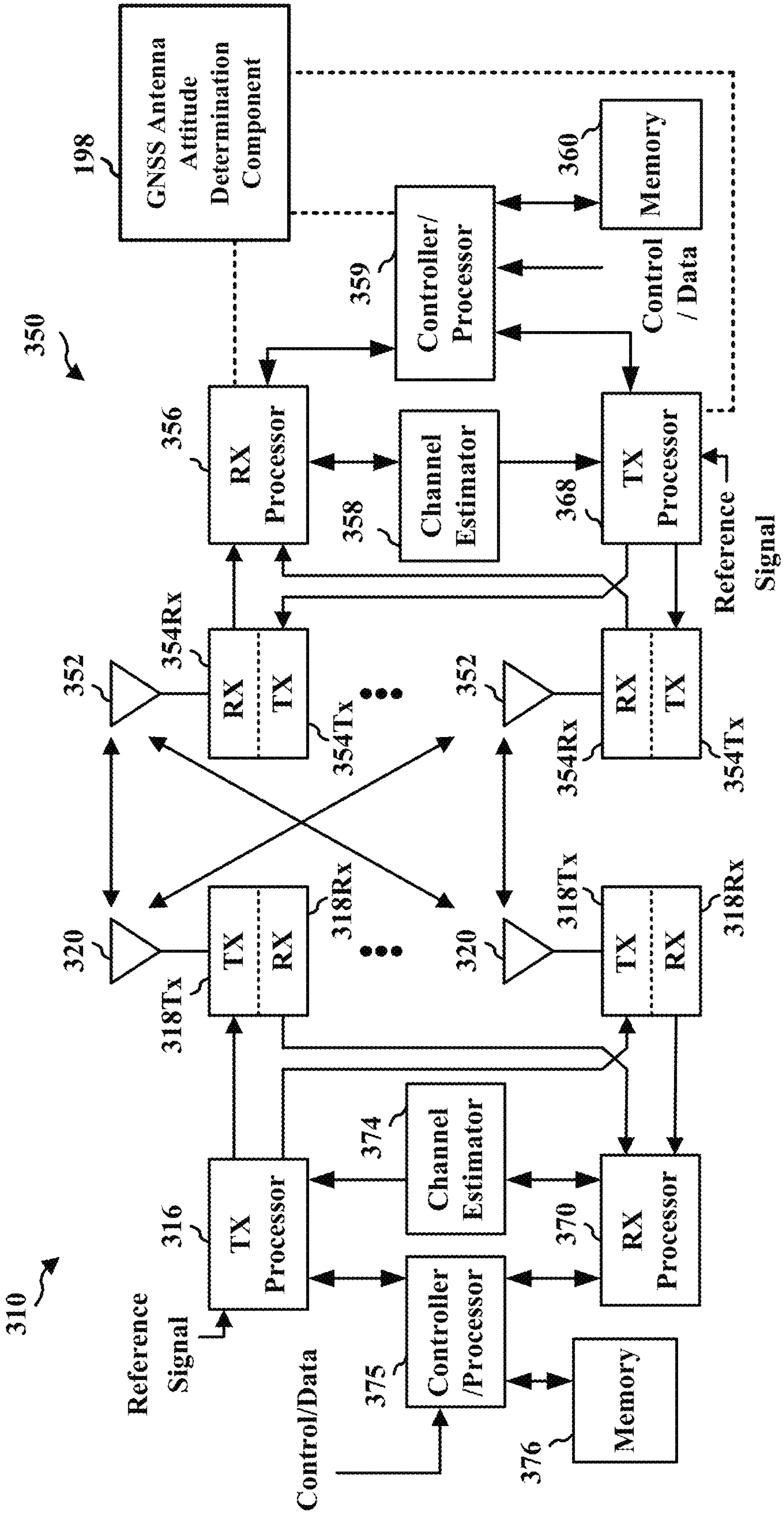
FIG. 3 is a diagram illustrating an example of a base station and user equipment (UE) in an access network.

FIG. 3 is a block diagram of a base station 310 in communication with a UE 350 in an access network. In the DL, Internet protocol (IP) packets may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318Tx. Each transmitter 318Tx may modulate a radio frequency (RF) carrier with a respective spatial stream for transmission.

At the UE 350, each receiver 354Rx receives a signal through its respective antenna 352. Each receiver 354Rx recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal includes a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with at least one memory 360 that stores program codes and data. The at least one memory 360 may be referred to as a computer-readable medium. In the UL, the controller/processor 359 provides demultiplexing between transport and logical channels, packet reassembly, deciphering, header decompression, and control signal processing to recover IP packets. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antennas 352 via separate transmitters 354Tx. Each transmitter 354Tx may modulate an RF carrier with a respective spatial stream for transmission.

The UL transmission is processed at the base station 310 in a manner similar to that described in connection with the receiver function at the UE 350. Each receiver 318Rx receives a signal through its respective antenna 320. Each receiver 318Rx recovers information modulated onto an RF carrier and provides the information to a RX processor 370.

The controller/processor 375 can be associated with at least one memory 376 that stores program codes and data. The at least one memory 376 may be referred to as a computer-readable medium. In the UL, the controller/processor 375 provides demultiplexing between transport and logical channels, packet reassembly, deciphering, header decompression, control signal processing to recover IP packets. The controller/processor 375 is also responsible for error detection using an ACK and/or NACK protocol to support HARQ operations.

At least one of the TX processor 368, the RX processor 356, and the controller/processor 359 may be configured to perform aspects in connection with the GAAD component 198 of FIG. 1.

Figure 4:
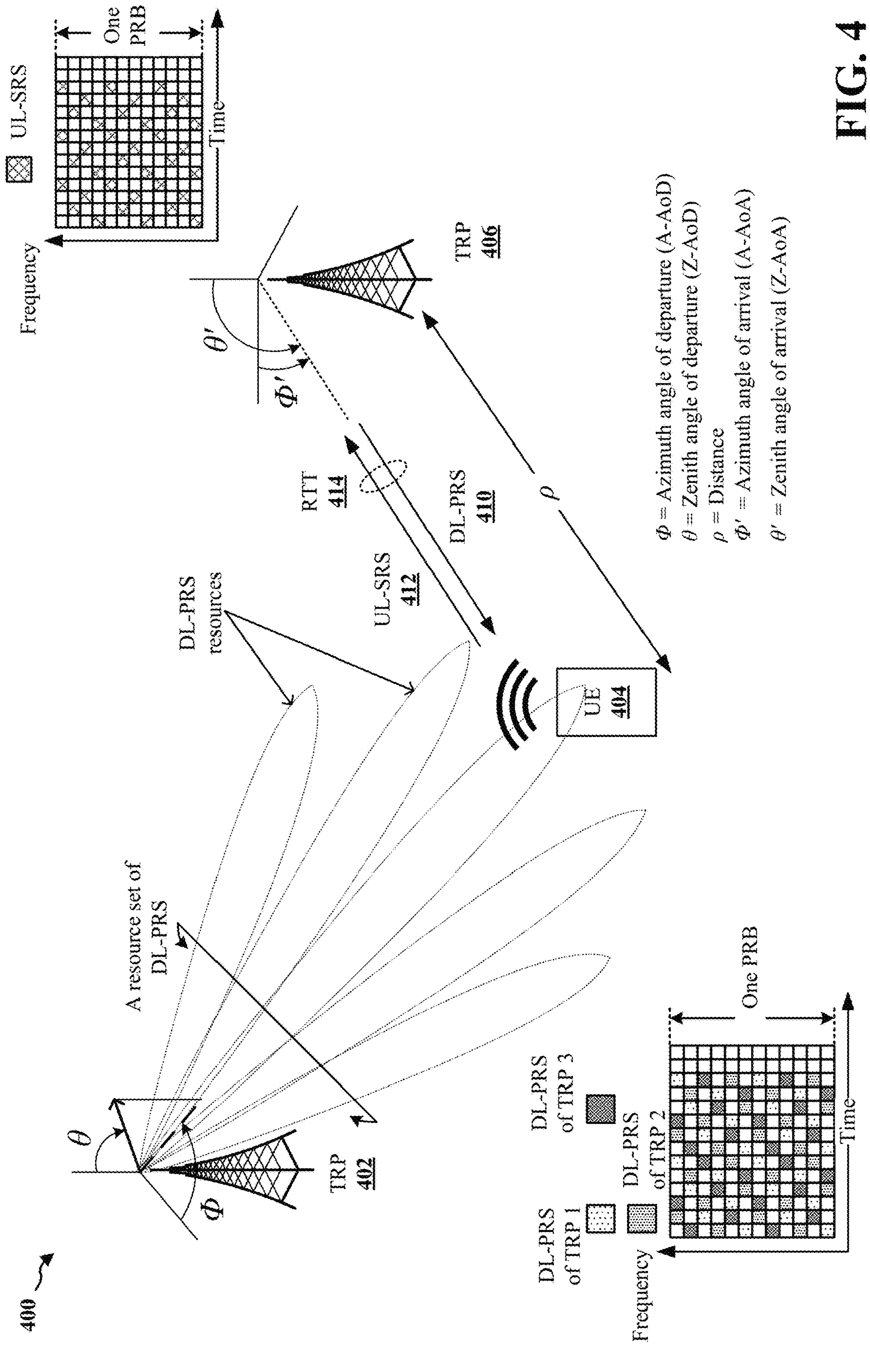
FIG. 4 is a diagram illustrating an example of a UE positioning based on reference signal measurements.

FIG. 4 is a diagram 400 illustrating an example of a UE positioning based on reference signal measurements. The UE 404 may transmit UL-SRS 412 at time TsRS TX and receive DL PRS (DL-PRS) 410 at time TPRS_RX. The TRP 406 may receive the UL-SRS 412 at time TSRS_RX and transmit the DL-PRS 410 at time TPRS_TX. The UE 404 may receive the DL-PRS 410 before transmitting the UL-SRS 412, or may transmit the UL-SRS 412 before receiving the DL-PRS 410. In both cases, a positioning server (e.g., location server(s) 168) or the UE 404 may determine the RTT 414 based on $||T_{SRS\_RX}-T_{PRS\_TX}|-|T_{SRS\_TX}-T_{PRS\_RX}||$. Accordingly, multi-RTT positioning may make use of the UE Rx−Tx time difference measurements (i.e., $|T_{SRS\_TX}-T_{PRS\_RX}|$) and DL-PRS reference signal received power (RSRP) (DL-PRS-RSRP) of downlink signals received from multiple TRPs 402, 406 and measured by the UE 404, and the measured TRP Rx−Tx time difference measurements (i.e., $|T_{SRS\_RX}-T_{PRS\_TX}|$) and UL-SRS-RSRP at multiple TRPs 402, 406 of uplink signals transmitted from UE 404. The UE 404 measures the UE Rx−Tx time difference measurements (and optionally DL-PRS-RSRP of the received signals) using assistance data received from the positioning server, and the TRPs 402, 406 measure the gNB Rx−Tx time difference measurements (and optionally UL-SRS-RSRP of the received signals) using assistance data received from the positioning server. The measurements may be used at the positioning server or the UE 404 to determine the RTT, which is used to estimate the location of the UE 404. Other methods are possible for determining the RTT, such as for example using DL-TDOA and/or UL-TDOA measurements.

DL-AoD positioning may make use of the measured DL-PRS-RSRP of downlink signals received from multiple TRPs 402, 406 at the UE 404. The UE 404 measures the DL-PRS-RSRP of the received signals using assistance data received from the positioning server, and the resulting measurements are used along with the azimuth angle of departure (A-AoD), the zenith angle of departure (Z-AoD), and other configuration information to locate the UE 404 in relation to the neighboring TRPs 402, 406.

DL-TDOA positioning may make use of the DL reference signal time difference (RSTD) (and optionally DL-PRS-RSRP) of downlink signals received from multiple TRPs 402, 406 at the UE 404. The UE 404 measures the DL RSTD (and optionally DL-PRS-RSRP) of the received signals using assistance data received from the positioning server, and the resulting measurements are used along with other configuration information to locate the UE 404 in relation to the neighboring TRPs 402, 406.

UL-TDOA positioning may make use of the UL relative time of arrival (RTOA) (and optionally UL-SRS-RSRP) at multiple TRPs 402, 406 of uplink signals transmitted from UE 404. The TRPs 402, 406 measure the UL-RTOA (and optionally UL-SRS-RSRP) of the received signals using assistance data received from the positioning server, and the resulting measurements are used along with other configuration information to estimate the location of the UE 404.

UL-AoA positioning may make use of the measured azimuth angle of arrival (A-AoA) and zenith angle of arrival (Z-AoA) at multiple TRPs 402, 406 of uplink signals transmitted from the UE 404. The TRPs 402, 406 measure the A-AoA and the Z-AoA of the received signals using assistance data received from the positioning server, and the resulting measurements are used along with other configuration information to estimate the location of the UE 404.

Additional positioning methods may be used for estimating the location of the UE 404, such as for example, UE-side UL-AoD and/or DL-AoA. Note that data/measurements from various technologies may be combined in various ways to increase accuracy, to determine and/or to enhance certainty, to supplement/complement measurements, and/or to substitute/provide for missing information.

In addition to identifying a position, in some aspects, it may be important to determine an attitude of a UE (e.g., a wireless device such as a smartphone or a vehicle) for modern location systems. In a static start scenario, heading (or attitude) estimation may be an issue in many existing market location products. Some solutions to attitude and/or heading estimation may use multiple GNSS antennas with known relative geometry. In some aspects, a solution to attitude and/or heading estimation may use a single multi-frequency GNSS antenna.

Figure 5:
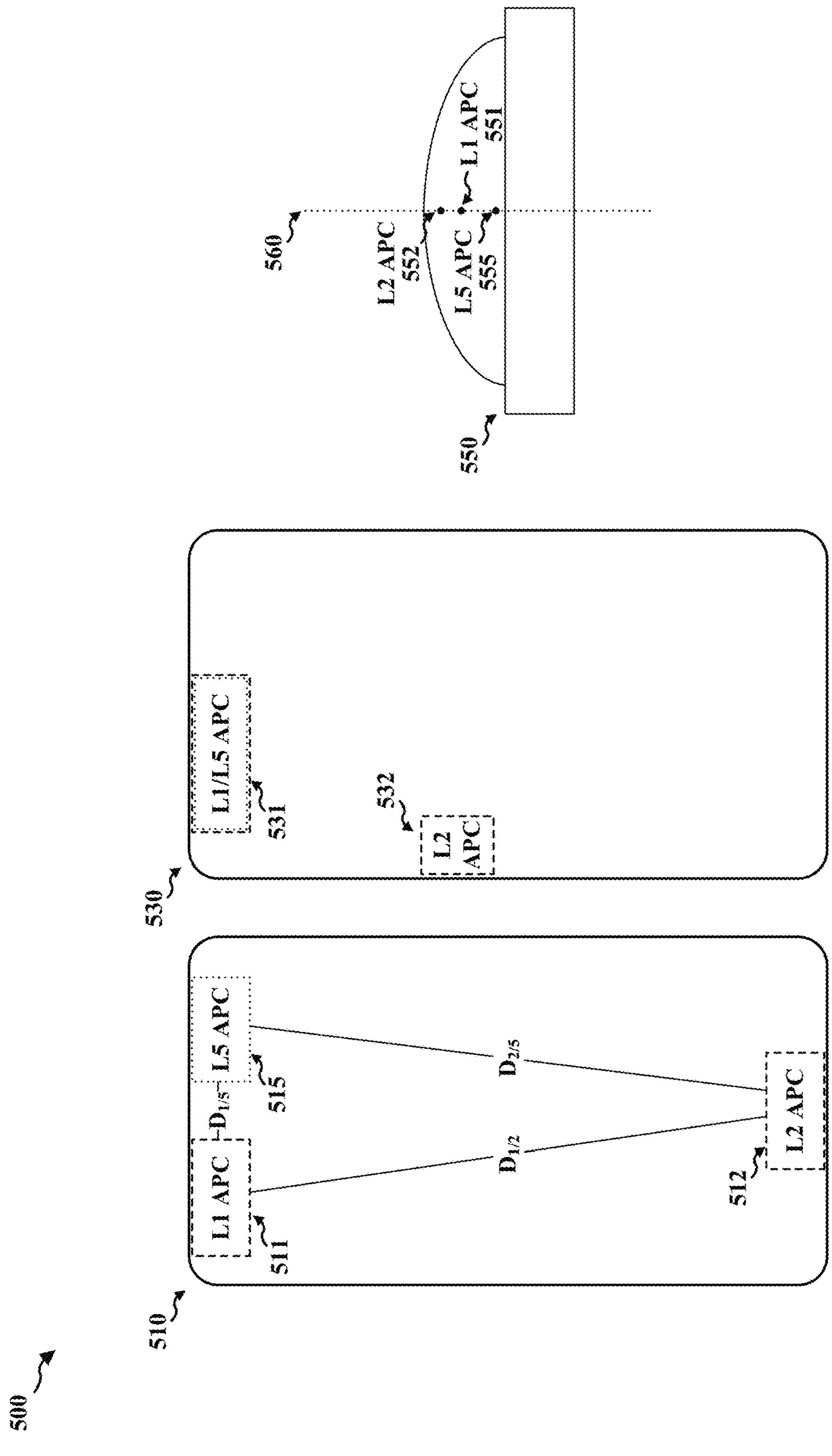
FIG. 5 is a diagram illustrating different UEs and antennas with different APCs associated with different frequency ranges in accordance with some aspects of the disclosure.

FIG. 5 is a diagram 500 illustrating different UEs (e.g., UE 510 and UE 530) and antennas (e.g., antenna 511, antenna 512, antenna 515, antenna 531, antenna 532, and antenna 550) with different APCs associated with different frequency ranges in accordance with some aspects of the disclosure. In some aspects of multi-frequency GNSS receiver systems, the antenna PCO between antennas associated with multiple frequency bands may not be negligible in precise positioning applications. For example, the GNSS antenna offset between an L1 phase center (e.g., associated with antenna 511 or 531) and one of an L2 phase center (e.g., associated with antenna 512 or 532) or an L5 phase center (e.g., associated with antenna 515 or 531) may be 1-10 cm (e.g., approximately 4 or 5 cm). For example, in relation to UE 510, a set of PCOs may include a first PCO (e.g., $D_{1/2}$) between an L1 APC associated with antenna 511 and an L2 APC associated with antenna 512, a second PCO (e.g., $D_{1/5}$) between an L1 APC associated with antenna 511 and an L5 APC associated with antenna 515, and a third PCO (e.g., $D_{2/5}$) between an L2 APC associated with antenna 512 and an L5 APC associated with antenna 515. Issues arising from the PCO between antennas associated with multiple frequency bands (e.g., PCO-based issues) may exist for nearly all GNSS antennas, where each GNSS antenna may experience the PCO-based issues with different magnitudes. For example, larger PCOs, in some aspects, may appear more often in lower cost GNSS antennas (e.g., handset or automotive grade GNSS antennas).

In some aspects, a single multi-frequency GNSS antenna 550 (e.g., an antenna assembly or an antenna structure) may be associated with multiple APCs. For example, the multi-frequency GNSS antenna 550 may be associated with L1 APC 551, L2 APC 552, and L5 APC 555. In some aspects, the L1 APC 551, the L2 APC 552, and/or the L5 APC 555 may lie on a central axis 560. The APCs and PCOs may be device-dependent as can be seen in the difference between UE 510 and UE 530 and the multi-frequency GNSS antenna 550. While a multi-frequency GNSS antenna is described above (and may be sold and/or provided by a manufacturer) as a single antenna, antenna assembly, or antenna structure, the multi-frequency GNSS antenna may include multiple antennas. Each antenna of a multi-frequency GNSS antenna (or an antenna assembly or antenna structure) may be associated with one or more frequency ranges.

Figure 6:
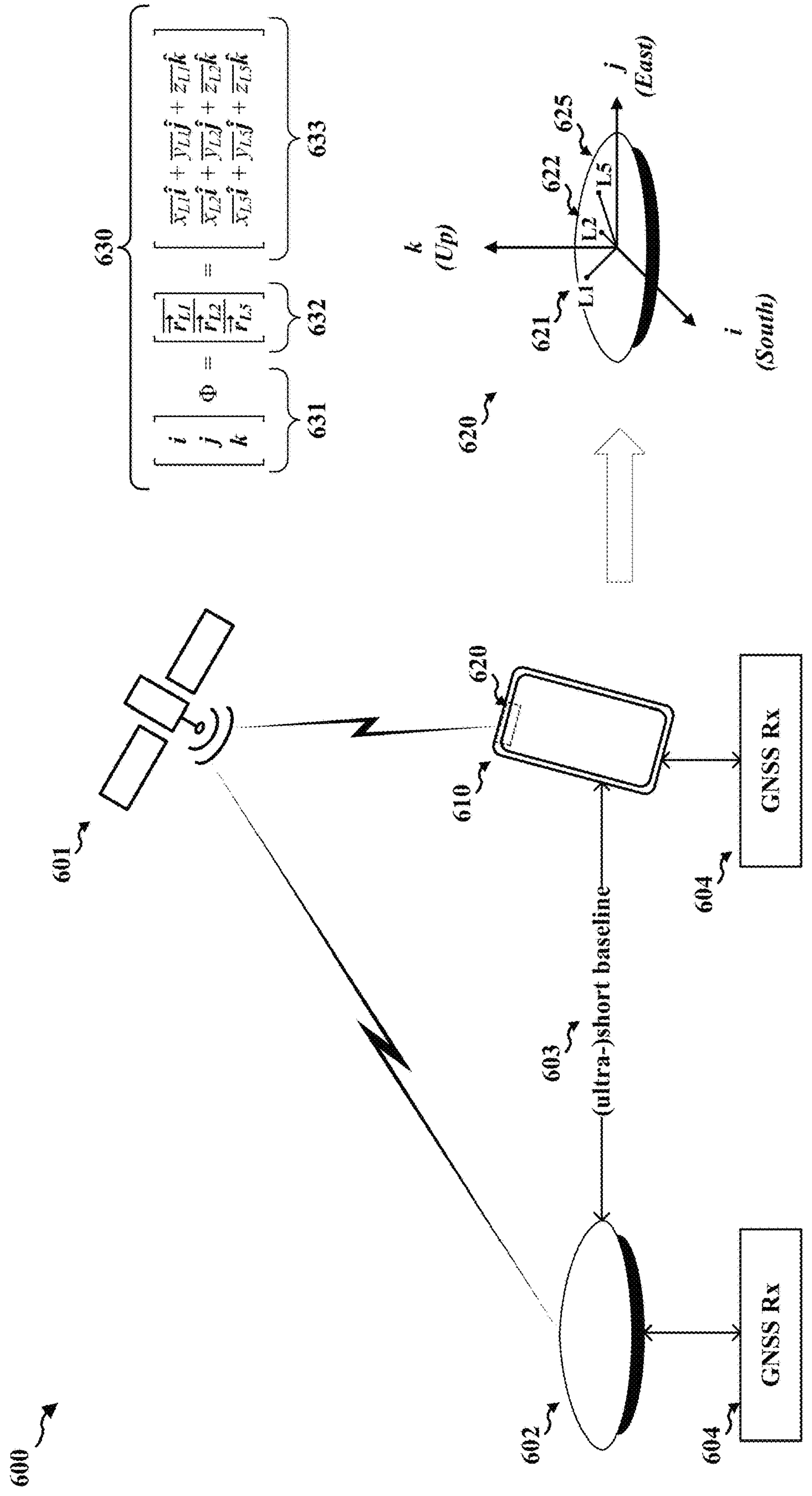
FIG. 6 is a diagram illustrating a premeasurement associated with determining a set of APCs and/or phase center offsets (PCOs) associated with a particular device (or class of devices) in accordance with some aspects of the disclosure.

FIG. 6 is a diagram 600 illustrating a premeasurement associated with determining a set of APCs and/or PCOs associated with a particular device (or class of devices) in accordance with some aspects of the disclosure. In some aspects, the device (e.g., the UE 610) may be tested and/or measured in an "open-sky" environment (e.g., an environment with minimal multipathing). The testing, in some aspects, may involve a satellite 601 and a reference antenna 602. In some aspects, the UE 610 and the reference antenna 602 may be separated by an (ultra-)short baseline distance 603. The UE 610 and the reference antenna may communicate with one or more GNSS receiver(s) 604.

The UE 610 may be associated with one or more (single, or multi-, frequency) antenna(s) 620. The one or more (single, or multi-, frequency) antenna(s) 620, in some aspects, may be associated with a set of APCs including an L1 APC 621, an L2 APC 622, and/or an L5 APC 625. The determination of the APCs, in some aspects, may occur over multiple constellation cycles (e.g., N*12 hrs. or one or more days) and may measure an average real-time kinematic (RTK) position ($\overline{\vec{r}_{L\iota}}$ for i∈{1, 2, 5}) The different APCs may be represented by one of the matrices in the set of matrices 630. For example, the different APCs may be represented by a matrix of orthogonal vectors ($\hat{\iota}$, $\hat{j}$, $\hat{k}$) and a rotation matrix Φ (e.g., matrix representation 631), an average position vector matrix 632, and/or an average position matrix 633 (e.g., in terms of a set of vectors $\hat{\iota}$, $\hat{j}$, $\hat{k}$ along a set of orthogonal axes and an average distance, $x_{Li}$, $y_{Li}$, $z_{Li}$, respectively, along the axis determined for a corresponding frequency range "Li" for i∈{1, 2, 5}). In some aspects, the APCs determined using the setup illustrated in diagram 600 for a particular device (e.g., UE 610) and the determined APCs may be used for and/or applied to other devices of a same make and/or model (e.g., may be provided to similar devices to determine an orientation and/or heading).

The operations described in relation to UE 610, in some aspects, may be performed for one or more other wireless devices (e.g., UEs) corresponding to a UE that may use the determined set of APCs and/or PCOs. The correspondence may between a wireless device using the determined set of APCs and/or PCOs and the one or more other wireless devices may be based on being a same make and model of device or based on including a same make and model (or manufacture) of GNSS antenna (where a related, or relative, orientation may be determined based on known configuration of a make and model of a particular device including the GNSS antenna). For example, a particular make and model of cellular phone (or other wireless device) may be configured with information regarding a set of APCs and/or PCOs determined based on testing one or more other cellular phones (or other wireless devices) of the particular make and model of cellular phone (or other wireless device). In some aspects, the testing may be performed on one or more other GNSS antennas of a particular make and manufacture corresponding to (e.g., included in) one or more particular makes and models of wireless devices.

Figure 7:
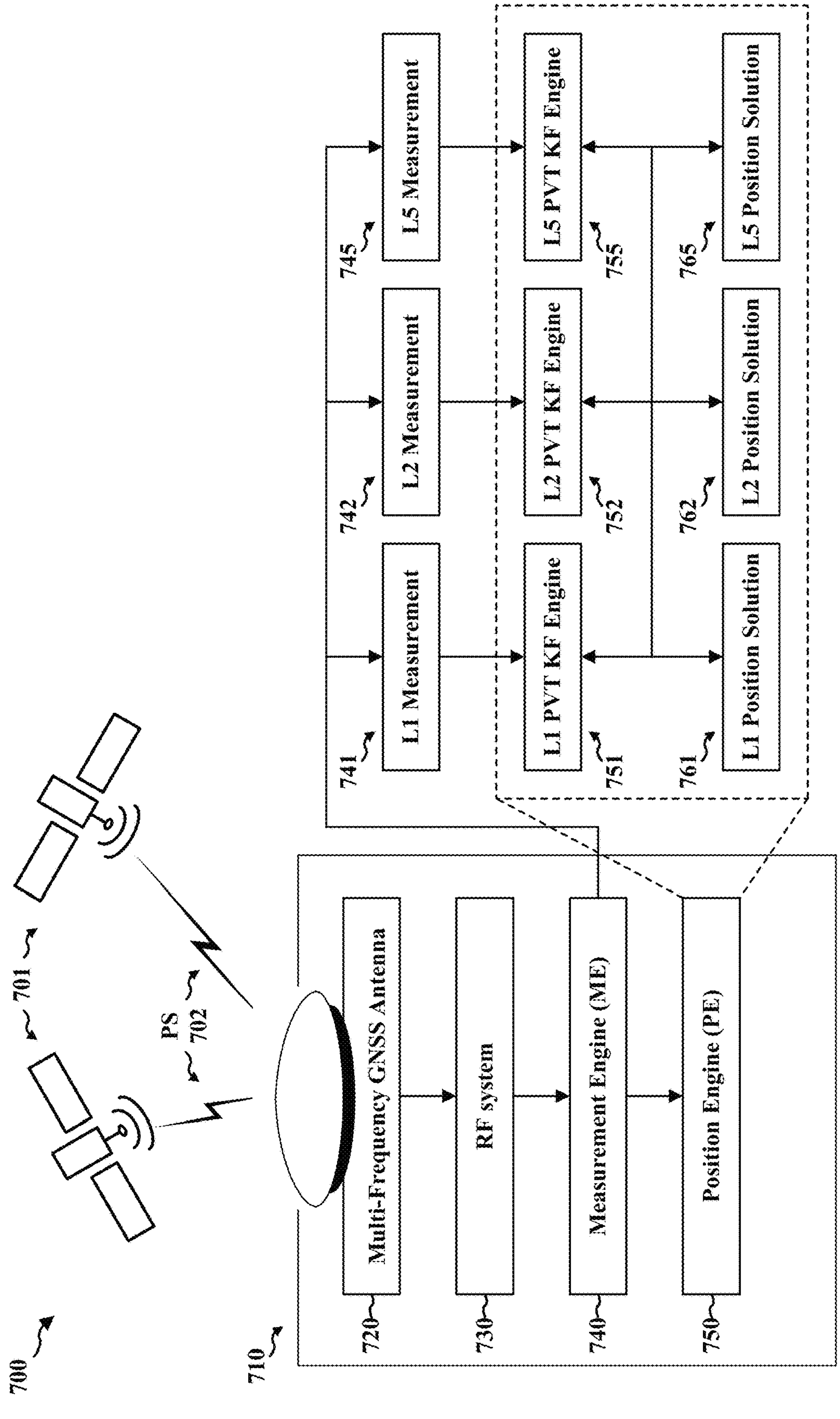
FIG. 7 is a diagram illustrating components of a position and orientation estimation and/or determination in accordance with some aspects of the disclosure.

FIG. 7 is a diagram 700 illustrating components of a position and orientation estimation and/or determination in accordance with some aspects of the disclosure. Diagram 700 illustrates a UE 710 interacting with one or more satellites 701 providing PS 702 for estimating a position and/or orientation of the UE 710. For example, the one or more satellites may transmit GNSS positioning signals. The UE 710 may include a multi-frequency GNSS antenna 720 (or multiple single-frequency GNSS antennas), an RF system 730, a measurement engine 740, and a position engine 750. In some aspects, the measurement engine 740 may acquire a set of measurements associated with a set of frequency ranges via the multi-frequency GNSS antenna 720. For example, the set of measurements may include one or more of an L1 measurement 741, and L2 measurement 742, and/or an L5 measurement 745.

In some aspects, the set of measurements may be used to estimate a state of the UE 710 (e.g., a position, velocity, and time) separately for each frequency band using a corresponding GNSS measurement. The receiver side antenna PCO, in some aspects, may not be compensated for in standard ranging equations. As illustrated in diagram 700, in a triple band GNSS system, for example, the position engine 750 may estimate and output three positions $\vec{r}_{L1}$, $\vec{r}_{L2}$ and $\vec{r}_{L5}$. In the state estimation process, multiple position, velocity and time (PVT) Kalman filter (KF) engines (e.g., L1 PVT KF engine 751, L2 PVT KF engine 752, and/or L5 PVT KF engine 755) may be coupled together in a cooperative positioning mode using known relative geometry, in some aspects, to achieve faster fixed solutions and fewer wrong fixes than uncoupled estimations associated with, e.g., L1 position solution 761, L2 position solution 762, and/or L5 position solution 765.

Figure 8:
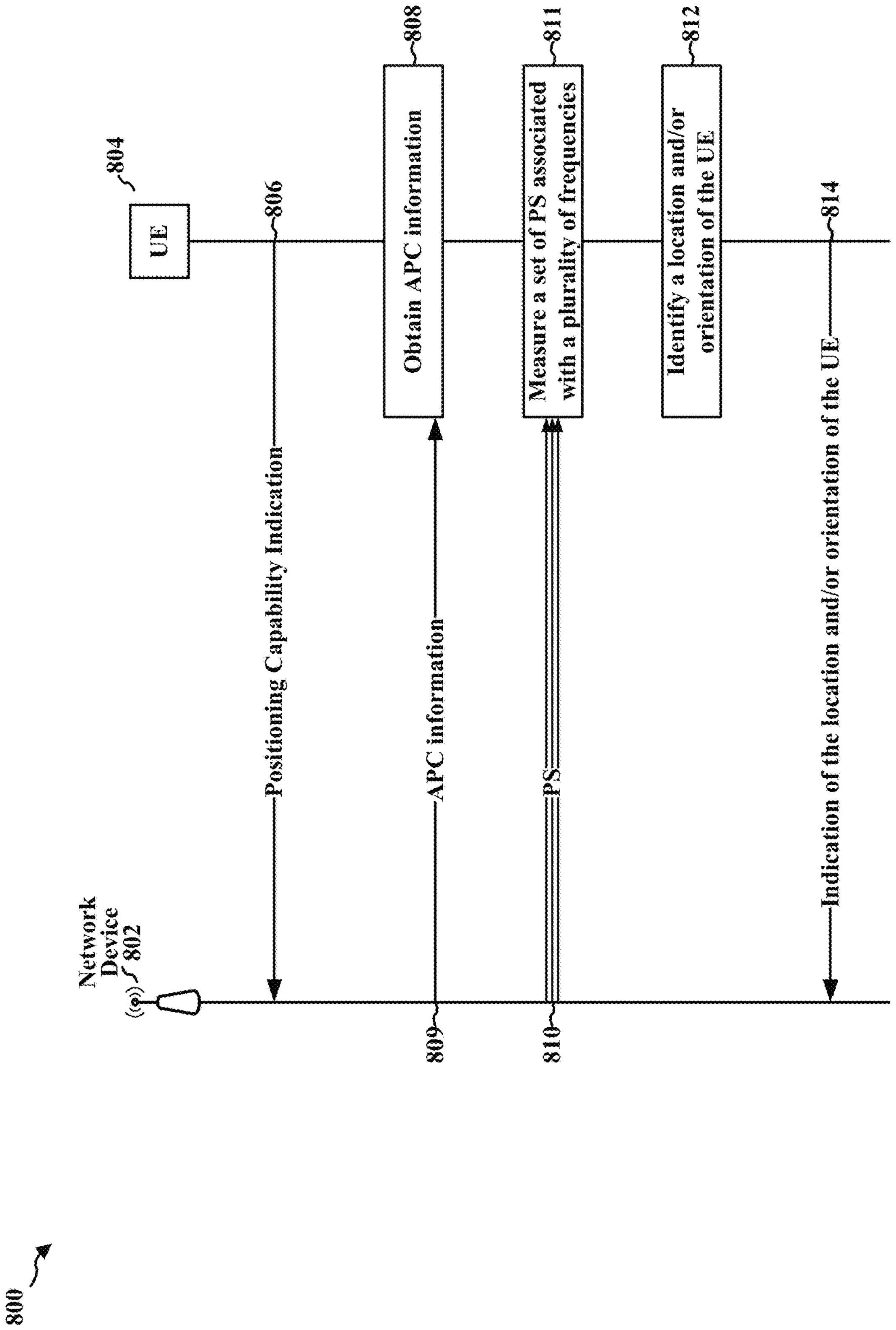
FIG. 8 is a call flow diagram illustrating a method for attitude determination at a wireless device using a multi-frequency global navigation satellite system (GNSS) antenna in accordance with some aspects of the disclosure.

FIG. 8 is a call flow diagram 800 illustrating a method for attitude (or orientation) determination at a wireless device using a multi-frequency GNSS antenna (e.g., a single multi-frequency GNSS antenna) in accordance with some aspects of the disclosure. The functions ascribed to the network device 802, in some aspects, may be performed by one or more components of a network such as a network entity, a network node, a network device, a satellite, or a base station (a single network entity/node/device or a disaggregated network entity/node/device as described above in relation to FIG. 1). Similarly, the functions ascribed to the UE 804, in some aspects, may be performed by one or more components of a wireless device supporting communication with a network entity/node/device (or satellite). Accordingly, references to "transmitting" in the description below may be understood to refer to a first component of the network device 802 (or the UE 804) outputting (or providing) an indication of the content of the transmission to be transmitted by a different component of the network device 802 (or the UE 804). Similarly, references to "receiving" in the description below may be understood to refer to a first component of the network device 802 (or the UE 804) receiving a transmitted signal and outputting (or providing) the received signal (or information based on the received signal) to a different component of the network device 802 (or the UE 804).

The UE 804, in some aspects, may transmit, and the network device 802 may receive, an indication 806 of a capability of the UE 804 to perform a GNSS antenna based positioning operation. In some aspects, the indication may include an identifier of the wireless device that may be used to identify associated APC information. The UE, at 808, may obtain APC information corresponding to a plurality of frequencies (e.g., APCs for one or more antennas associated with the plurality of frequencies). The APC information, in some aspects, may include pre-configured information (e.g., based on the premeasurement discussed in relation to FIG. 6). In some aspects, the network device 802 may provide, and the UE 804 may receive APC information 809 indicating an APC associated with a plurality of frequency ranges. In some aspects, the APC information 809 may be provided based on the identifier included in the indication 806. In some aspects using pre-configured APC information, obtaining the APC information at 808 may precede transmitting the indication 806 and the APC information 809 may not be received by the UE 804 (or transmitted by the network device 802)

The network device 802 may transmit, and the UE 804 may receive, a set of PS 810. The set of PS 810, in some aspects, may be positioning signals associated with a GNSS (e.g., if the network device is a satellite) or a set of PRS (e.g., if the network device is a base station). In some aspects, the set of PS 810, may, at 811, be measured by the UE 804 and used by the UE 804 to determine and/or identify, at 812, a location and/or orientation (or attitude) of the UE 804. For example, in some aspects, using the known positions of each frequency band's APC, the UE 804 may, at 812, compute the device attitude by a rotation matrix into an East-North-Up (ENU) or $(\hat{\imath}, \hat{\jmath}, \hat{k})$ frame. For example, from the position determination as described in relation to FIG. 7, the positions of each APC for a plurality of frequencies (e.g., L1, L2, and/or L5) may be known (based on the APC information obtained at 808), e.g., the process described in relation to FIG. 7 may produce a set of position measurements $$\begin{bmatrix} \vec{r}_{L1} \\ \vec{r}_{L2} \\ \vec{r}_{L5} \end{bmatrix} = \begin{bmatrix} x_{L1}\hat{\imath} + y_{L1}\hat{\jmath} + z_{L1}\hat{k} \\ x_{L2}\hat{\imath} + y_{L2}\hat{\jmath} + z_{L2}\hat{k} \\ x_{L5}\hat{\imath} + y_{L5}\hat{\jmath} + z_{L5}\hat{k} \end{bmatrix}.$$

Using the rotation matrix (Φ) from a premeasurement operation as described in relation to FIG. 6 to compute the device body frame attitude in an ENU or $(\hat{\imath}, \hat{\jmath}, \hat{k})$ frame:

$$\begin{bmatrix} a\hat{\imath} \\ b\hat{\jmath} \\ c\hat{k} \end{bmatrix} = \begin{bmatrix} x_{L1}\hat{\imath} + y_{L1}\hat{\jmath} + z_{L1}\hat{k} \\ x_{L2}\hat{\imath} + y_{L2}\hat{\jmath} + z_{L2}\hat{k} \\ x_{L5}\hat{\imath} + y_{L5}\hat{\jmath} + z_{L5}\hat{k} \end{bmatrix} \Phi^{-1}.$$

The final device attitude may then be expressed into 3 rotation angles (α, β, γ) in roll, pitch and yaw from device frame to ENU frame.

The rotation may be expressed as a matrix $R=R_z(\alpha)R_y(\beta)R_x(\gamma)$, where a yaw may be defined as $$R_z(\alpha) = \begin{bmatrix} \cos\alpha & -\sin\alpha & 0 \\ \sin\alpha & \cos\alpha & 0 \\ 0 & 0 & 1 \end{bmatrix},$$

a pitch may be defined as $$R_y(\beta) = \begin{bmatrix} \cos\beta & 0 & \sin\beta \\ 0 & 1 & 0 \\ -\sin\beta & 0 & \cos\beta \end{bmatrix},$$

and a roll may be defined as $$R_x(\gamma) = \begin{bmatrix} 1 & 0 & 0 \\ 0 & \cos\gamma & -\sin\gamma \\ 0 & \sin\gamma & \cos\gamma \end{bmatrix}.$$

In some aspects, the combined matrix may be $$R = \begin{bmatrix} \cos\alpha*\cos\beta & \cos\alpha*\sin\beta*\sin\gamma - \sin\alpha*\cos\gamma & \cos\alpha*\sin\beta*\cos\gamma + \sin\alpha*\sin\gamma \\ \sin\alpha*\cos\beta & \sin\alpha*\sin\beta*\sin\gamma + \cos\alpha*\cos\gamma & \sin\alpha*\sin\beta*\cos\gamma - \cos\alpha*\sin\gamma \\ -\sin\beta & \cos\beta*\sin\gamma & \cos\beta\cos\gamma \end{bmatrix}$$

In some aspects, a Kalman filter (KF) may be used to implement both the position and orientation and/or attitude estimation and/or determination at 812 and as discussed in relation to FIG. 7. In some aspects, for a KF state under estimation (X), an L1 position and 3D attitude of the device may be estimated, where $X=[x_{L1}, y_{L1}, z_{L1}, \alpha, \beta, \gamma, clk, clk\_rate]$, where $x_{L1}$, $y_{L1}$, $z_{L1}$, α, β, γ are defined as above and clk and clk_rate refer to information regarding the clock used to synchronize the time between the UE 804 (e.g., a receiver) and the network device 802 (e.g., a satellite) and the clock rate used to estimate the distance between the satellite and the receiver (and/or to estimate the ionospheric delay), respectively. Based on the estimated ionospheric delay, the UE 804 may attempt to correct for the ionospheric delay that may result in an ionospheric delay residual (represented below as an iono_residual(Li) term for a frequency range "Li") representing a difference between the estimated ionospheric delay and an actual ionospheric delay. In a set of ranging equations (observation) step, the following ranges (e.g., positions and/or distances) may be estimated:

$$\text{Range}_{L1} = f_1[3Dpos(L1), \text{iono\_residual}(L1)] = f_1[x_{L1}, y_{L1}, z_{L1}, \text{iono\_residual}(L1)];$$

$$\text{Range}_{L2} = f_2[3Dpos(L2), \text{iono\_residual}(L2)] = f_2[3Dpos(L1), PCO(L1, L2)\cdot f_{2b}(\alpha, \beta, \gamma), \text{iono\_residual}(L2)]; \text{ and}$$

$$\text{Range}_{L5} = f_5[3Dpos(L5), \text{iono\_residual}(L5)] = f_2[3Dpos(L1), PCO(L1, L5)\cdot f_{5b}(\alpha, \beta, \gamma), \text{iono\_residual}(L5)].$$

The ranges above may be corrected by base station measurements (e.g., RTK) with a relatively short baseline (to minimize the ionospheric delay residuals). In this way, the UE 804 (or wireless device) attitude may be estimated directly using the known geometry constrain between L1, L2 and L5 APC locations. For example, the system may conduct coordinate conversion in KF observation functions and perform cooperative positioning using premeasured (pre-survey) PCO information as discussed in relation to FIG. 6. For example, the PCO information may be based on a set of prior measurements of a second set of PS at each of the plurality of frequencies for each of one or more other wireless devices corresponding to the UE 804 (e.g., of the same make and model as the UE 804). In some aspects the position and orientation of the one or more other wireless devices may be known and the PCO information may be based on a location associated with the measurements of the second set of PS at each of the plurality of frequencies for each of the one or more wireless devices corresponding to the UE 804.

In some aspects, the plurality of frequencies, antennas, and/or APCs may include two frequencies, antennas, and/or APCs (e.g., dual bands such as L1 and L5). While the previous discussion of the use of three frequencies, antennas, and/or APCs, in some aspects, enables an estimation of a yaw, a pitch, and a roll, in some aspects, the use of two frequencies, antennas, and/or APCs may enable an identification of limited, but useful, attitude information.

Figure 9B:
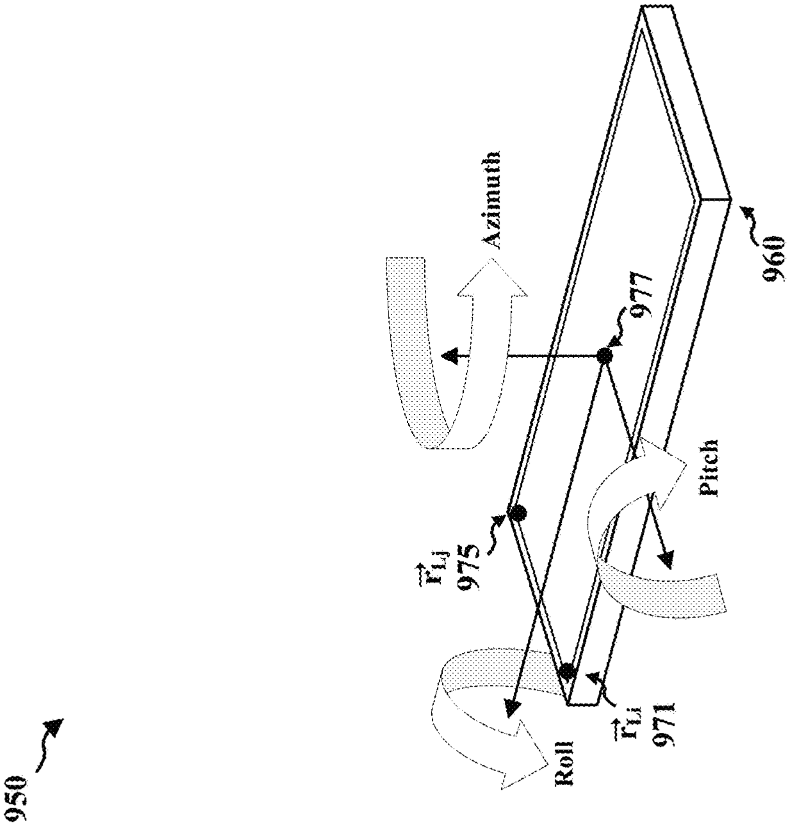
FIG. 9B is a diagram illustrating a smartphone handset forward heading estimation based on a dual band position determination with different single-frequency GNSS receivers and/or antennas.
Figure 9A:
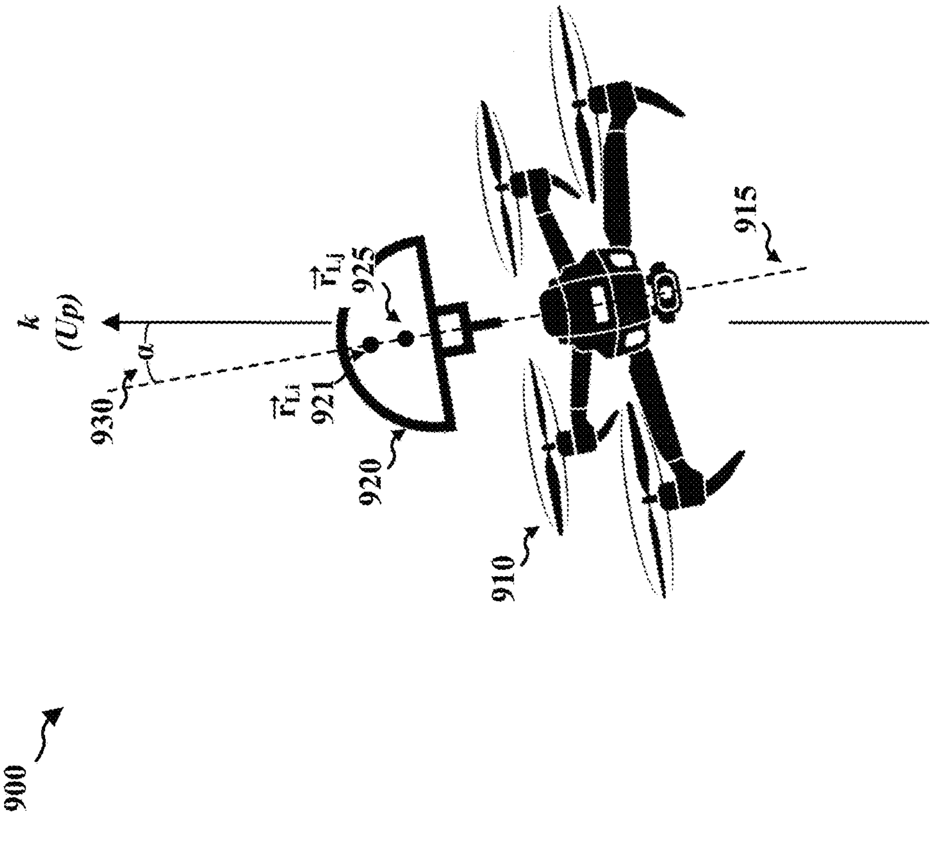
FIG. 9A is a diagram illustrating a drone tilt angle estimation based on a dual band GNSS receiver and/or antenna associated with a drone in accordance with some aspects of the disclosure.

FIG. 9A is a diagram 900 illustrating a drone tilt angle estimation based on a dual band GNSS receiver and/or antenna 920 associated with a drone 910 in accordance with some aspects of the disclosure. For example, a drone 910 may be associated with a dual band GNSS receiver and/or antenna 920 that may be symmetric around the axis 915 between a first APC and a second APC (e.g., associated with two of an L1, an L2, and an L5 frequency range). A positioning operation, at 812, may identify a first location 921 ($\vec{r}_{Li}$) of a first APC and a second location 925 ($\vec{r}_{Lj}$) of a second APC. While the exact orientation and/or attitude may not be able to be determined based on the two identified locations (e.g., the first location 921 and the second location 925), in some aspects, a tilt angle 930 (α) (e.g., an angle between an "up" direction and the axis 915 may be computed as $$\alpha = \tan^{-1}\left(\frac{\text{horizontal offset between } \vec{r}_{Li} \text{ and } \vec{r}_{Lj}}{\text{vertical offset between } \vec{r}_{Li} \text{ and } \vec{r}_{Lj}}\right).$$

While illustrated for a single multi-frequency GNSS receiver and/or antenna 920, the method may be applied based on multiple single-frequency GNSS receivers and/or antennas with known relative geometry.

FIG. 9B is a diagram 950 illustrating a smartphone handset forward heading estimation based on a dual band position determination with different single-frequency GNSS receivers and/or antennas. For example, a handset's GNSS APCs may be located at the corners of a UE 960 (e.g., a smartphone that may be an example of the UE 804) and all on a plane. For a dual-frequency GNSS UE, a positioning operation, at 812, may identify a first location 971 ($\vec{r}_{Li}$) of a first APC and a second location 975 ($\vec{r}_{Lj}$) of a second APC. In order to determine a heading, the UE 960 (or the UE 804) may assume a pose (or set of candidate poses) of the UE 960 (or the UE 804) associated with a reading position (e.g., with the back of the phone pointing generally toward the floor or "down" direction, with a top of the phone pointing generally toward an "up" direction, or with some other set of constraints describing normal use taking into account different possible modes of use such as in a vertical orientation, a horizontal orientation, for reading while looking down, or as a heads up display).

For example, the first location 971 ($\vec{r}_{Li}$) and the second location 975 ($\vec{r}_{L2}$) may typically be at the same height (e.g., with a roll≈0) when reading in a first mode illustrated in diagram 950 with a pitch≠0 (unless the phone is put on a flat surface). The horizontal location, in some aspects, may then be used to estimate a yaw (e.g., an angular rotation around the azimuth. The axes used to define the roll, pitch, and yaw may be defined based on a point 977 (e.g., a "center") of the UE 960 or some other known point associated with the UE 960. A navigation application and/or function, in some aspects, may use a forward, or roll, vector. Accordingly, based on the horizontal 2D vector from the first location 971 ($\vec{r}_{Li}$) to the second location 975 ($\vec{r}_{L2}$) may be given by $$\vec{v} = (x_{Lj} - x_{Li}, y_{Lj} - y_{Li})$$

and the forward, or roll, vector (or the horizontal component) identified as a forward direction may be estimated by rotating $\vec{v}$ clockwise by 90°

$$\left(\text{e.g., } \overrightarrow{\text{Roll}} = (y_{L2} - y_{L1}, x_{L1} - x_{L2})\right).$$

In some aspects, the UE 804 may transmit, and the network device 802 may receive, an indication 814 of the location and/or orientation of the UE 804 as determined and/or identified at 812. The orientation and/or attitude determined and/or identified at 812, in some aspects, may be used in association with one or more applications at the UE 804, at the network device 802, or within a core network (e.g., core network 120 of FIG. 1).

Figure 10:
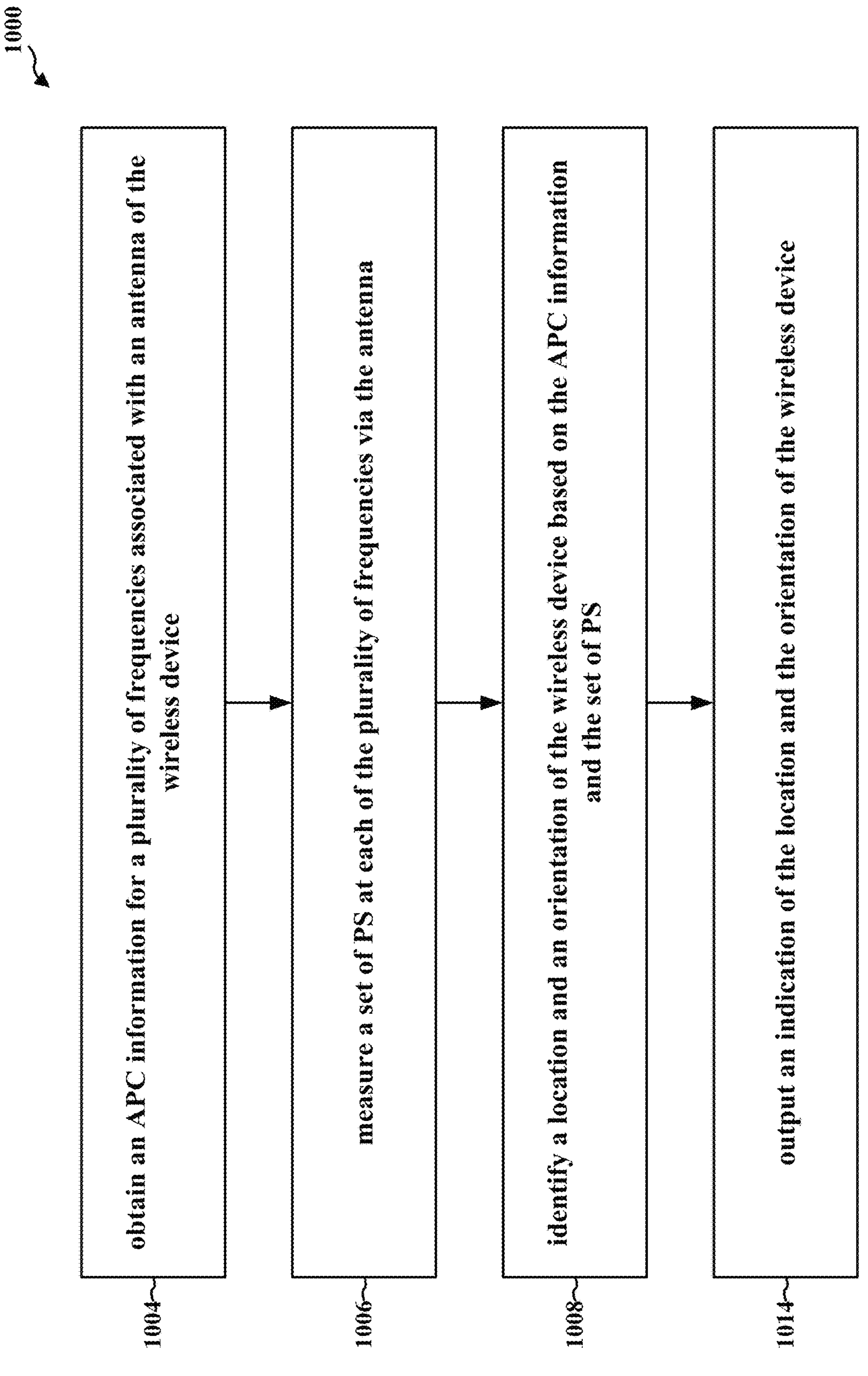
FIG. 10 is a flowchart of a method of wireless communication.

FIG. 10 is a flowchart 1000 of a method of wireless communication. The method may be performed by a UE (e.g., the UE 104, 710, 804, 960; the drone 910; the apparatus 1204). In some aspects, the UE may transmit, to a network device, a capability indication of a capability to identify the location and the orientation of the UE based on APC information for a plurality of frequencies associated with an antenna (e.g., an antenna assembly or antenna structure) of the UE. In some aspects, the capability indication further indicates an identifier of the UE associated with the APC information. For example, referring to FIG. 8, the UE 804 may transmit the indication 806 of a capability of the UE 804 to perform a GNSS antenna based positioning operation.

At 1004, the UE may obtain APC information for a plurality of frequencies associated with the antenna of the UE. For example, 1004 may be performed by application processor(s) 1206, cellular baseband processor(s) 1224, transceiver(s) 1222, antenna(s) 1280, and/or GAAD component 198 of FIG. 12. In some aspects, obtaining the APC information may include receiving the APC information from the network device in response to transmitting the indication of the capability to identify the location and the orientation of the UE based on APC information. The APC information, in some aspects, may include PCO information relative to a point (e.g., a center or other defined location within the UE such as an APC associated with a first frequency of the plurality of frequencies) associated with the UE in a first orientation. In some aspects, the PCO information may be based on a set of prior measurements of a second set of PS at each of the plurality of frequencies for each of one or more other UEs corresponding to the UE where a position and an orientation of the one or more other UEs is known and the PCO information is based on a location associated with the measurements of the second set of PS at each of the plurality of frequencies for each of the one or more other UEs corresponding to the UE (e.g., as described in relation to FIGS. 6 and 8 above).

The APC information, in some aspects, may include a rotation matrix (e.g., as described in relation to matrix representation 631) based on a set of relative positions of an APC for each of the plurality of frequencies. The antenna, in some aspects may be a first (multi-frequency) antenna such that each of the plurality of frequencies is associated with the first antenna of the UE. In some aspects, each of the plurality of frequencies may be associated with a different antenna of the UE (where each of the different antennas may be included in a single antenna assembly). For example, referring to FIG. 8, the UE 804 may obtain, at 808, the APC information, e.g., via APC information 809 or pre-configured information.

At 1006, the UE may measure a set of PS at each of the plurality of frequencies via the antenna. For example, 1006 may be performed by application processor(s) 1206, cellular baseband processor(s) 1224, transceiver(s) 1222, antenna(s) 1280, and/or GAAD component 198 of FIG. 12. In some aspects, the PS may include at least one of PS associated with a GNSS or PRS. Referring to FIG. 8, for example, the UE 804 may, at 811, measure a set of PS 810.

At 1008, the UE may identify a location and an orientation of the UE based on the APC information and the set of PS. In some aspects, identifying the location and the orientation of the UE at 1008, the UE may determine a location and/or range of an APC associated with each of the plurality of frequencies. For example, the UE may use RTK positioning and/or a KF to identify the location and/or range of the APCs. In some aspects, the UE may determine, based on a set of relative locations of the APC associated with each of the plurality of frequencies, the orientation of the UE. In order to determine the orientation of the UE, the UE may determine a first location of the APC associated with a first frequency of the plurality of frequencies, and determine, based on the location of the APC associated with the first frequency and the (relative) ranges of the APC associated with each of the plurality of frequencies, the orientation of the UE. For example, 1008 may be performed by application processor(s) 1206, cellular baseband processor(s) 1224, transceiver(s) 1222, antenna(s) 1280, and/or GAAD component 198 of FIG. 12. For example, referring to FIG. 8, the UE 804 may determine and/or identify, at 812, a location and/or orientation (or attitude) of the UE 804.

In some aspects, the plurality of frequencies may include three frequencies, and identifying the orientation of the UE at 1008 may include identifying the orientation of the UE via a set of three rotation angles (e.g., a roll, pitch, and yaw) associated with a corresponding set of three axes of rotation. The plurality of frequencies, in some aspects, may include two frequencies, and identifying the orientation of the UE comprises identifying the orientation of the UE via a set of two rotation angles associated with a corresponding set of two axes of rotation. In some aspects, the plurality of frequencies may include two frequencies, and identifying the orientation of the UE at 1008 may include identifying the orientation of the UE via a set of three rotation angles associated with a corresponding set of three axes of rotation based on an expected orientation of the UE during use. The plurality of frequencies, in some aspects, may include two frequencies, and identifying the orientation of the UE at 1008 may include identifying a forward direction associated with UE via a set of one or more rotation angles associated with a corresponding set of one or more axes of rotation based on an expected orientation of the UE during use. For example, referring to FIGS. 8, 9A, and 9B, the UE 804 may determine and/or identify, at 812, a location and/or orientation (or attitude) of the UE 804, the drone 910, or the UE 960.

At 1014, the UE may output an indication of the location and the orientation of the UE. The indication of the location and the orientation, in some aspects, may be output for at least one of an application or a network node. In some aspects, to output the indication at 1014, the UE may transmit, to at least one of the application or the network node, the indication of the location and the orientation of the UE. For example, 1014 may be performed by application processor(s) 1206, cellular baseband processor(s) 1224, transceiver(s) 1222, antenna(s) 1280, and/or GAAD component 198 of FIG. 12. In some aspects, the application may be a navigation application that uses the orientation information. The indication of the location and the orientation of the UE, in some aspects, may be output, or be provided to, local applications operating on the UE. For example, referring to FIG. 8, the UE 804 may transmit indication 814 of the location and/or orientation of the UE 804 as determined and/or identified at 812.

Figure 11:
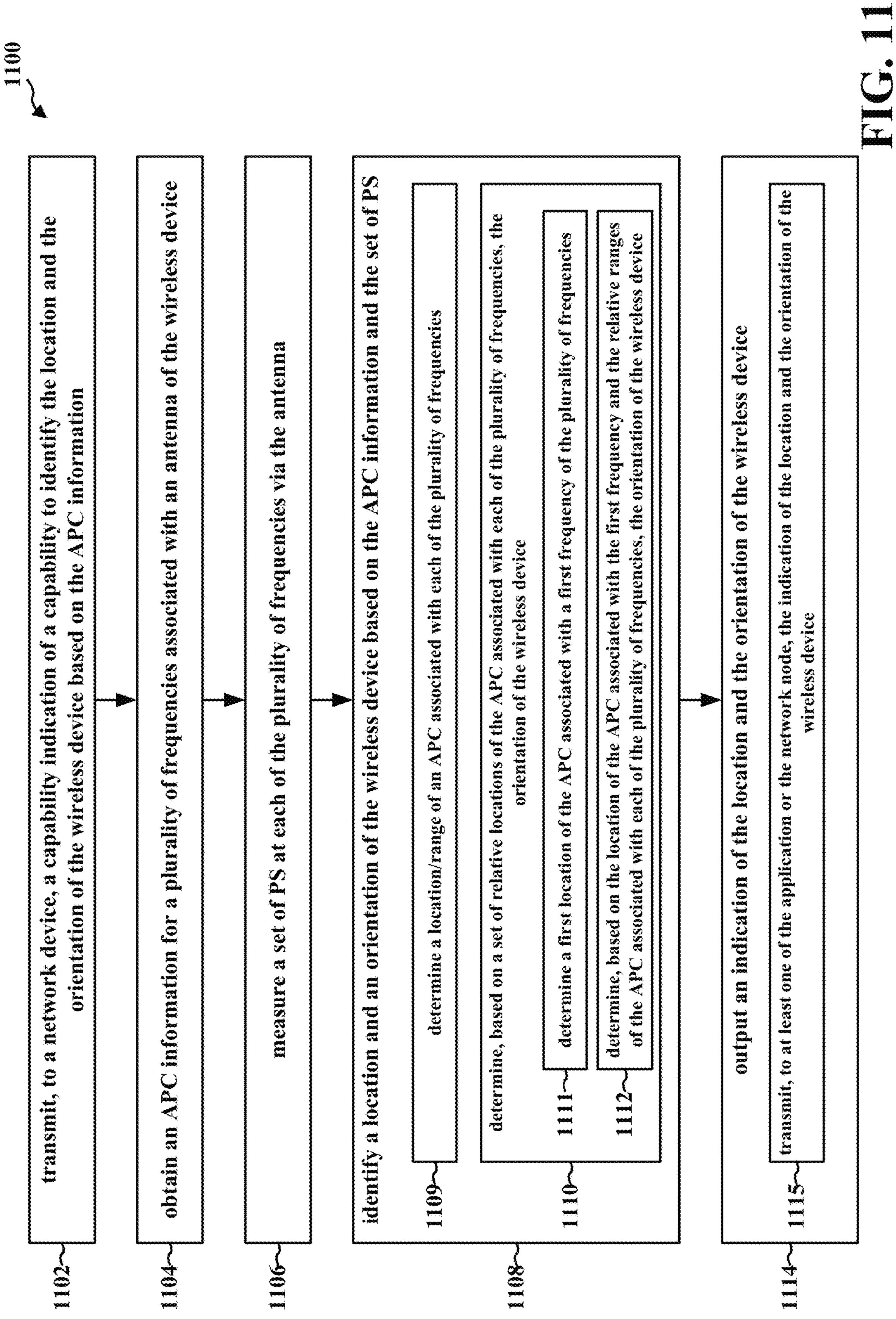
FIG. 11 is a flowchart of a method of wireless communication.

FIG. 11 is a flowchart 1100 of a method of wireless communication. The method may be performed by a UE (e.g., the UE 104, 710, 804, 960; the drone 910; the apparatus 1204). At 1102, the UE may transmit, to a network device, a capability indication of a capability to identify the location and the orientation of the UE based on APC information for a plurality of frequencies associated with an antenna (e.g., an antenna assembly or antenna structure) of the UE. For example, 1102 may be performed by application processor(s) 1206, cellular baseband processor(s) 1224, transceiver(s) 1222, antenna(s) 1280, and/or GAAD component 198 of FIG. 12. In some aspects, the capability indication further indicates an identifier of the UE associated with the APC information. For example, referring to FIG. 8, the UE 804 may transmit the indication 806 of a capability of the UE 804 to perform a GNSS antenna based positioning operation.

At 1104, the UE may obtain APC information for a plurality of frequencies associated with the antenna of the UE. For example, 1104 may be performed by application processor(s) 1206, cellular baseband processor(s) 1224, transceiver(s) 1222, antenna(s) 1280, and/or GAAD component 198 of FIG. 12. In some aspects, obtaining the APC information may include receiving the APC information from the network device in response to transmitting the indication of the capability to identify the location and the orientation of the UE based on APC information. The APC information, in some aspects, may include PCO information relative to a point (e.g., a center or other defined location within the UE such as an APC associated with a first frequency of the plurality of frequencies) associated with the UE in a first orientation. In some aspects, the PCO information may be based on a set of prior measurements of a second set of PS at each of the plurality of frequencies for each of one or more other UEs corresponding to the UE where a position and an orientation of the one or more other UEs is known and the PCO information is based on a location associated with the measurements of the second set of PS at each of the plurality of frequencies for each of the one or more other UEs corresponding to the UE (e.g., as described in relation to FIGS. 6 and 8 above).

The APC information, in some aspects, may include a rotation matrix (e.g., as described in relation to matrix representation 631) based on a set of relative positions of an APC for each of the plurality of frequencies. The antenna, in some aspects may be a first (multi-frequency) antenna such that each of the plurality of frequencies is associated with the first antenna of the UE. In some aspects, each of the plurality of frequencies may be associated with a different antenna of the UE (where each of the different antennas may be included in a single antenna assembly). For example, referring to FIG. 8, the UE 804 may obtain, at 808, the APC information, e.g., via APC information 809 or pre-configured information.

At 1106, the UE may measure a set of PS at each of the plurality of frequencies via the antenna. For example, 1106 may be performed by application processor(s) 1206, cellular baseband processor(s) 1224, transceiver(s) 1222, antenna(s) 1280, and/or GAAD component 198 of FIG. 12. In some aspects, the PS may include at least one of PS associated with a GNSS or PRS. Referring to FIG. 8, for example, the UE 804 may, at 811, measure a set of PS 810.

At 1108, the UE may identify a location and an orientation of the UE based on the APC information and the set of PS. In some aspects, identifying the location and the orientation of the UE at 1108, the UE may, at 1109, determine a location and/or range of an APC associated with each of the plurality of frequencies. For example, the UE may use RTK positioning and/or a KF to identify the location and/or range of the APCs. At 1110, the UE may determine, based on a set of relative locations of the APC associated with each of the plurality of frequencies, the orientation of the UE. In order to determine the orientation of the UE at 1110, the UE may, at 1111, determine a first location of the APC associated with a first frequency of the plurality of frequencies, and, at 1112, determine, based on the location of the APC associated with the first frequency and the (relative) ranges of the APC associated with each of the plurality of frequencies, the orientation of the UE. For example, 1108, 1109, 1110, 1111, and/or 1112 may be performed by application processor(s) 1206, cellular baseband processor(s) 1224, transceiver(s) 1222, antenna(s) 1280, and/or GAAD component 198 of FIG. 12. For example, referring to FIG. 8, the UE 804 may determine and/or identify, at 812, a location and/or orientation (or attitude) of the UE 804.

In some aspects, the plurality of frequencies may include three frequencies, and identifying the orientation of the UE at 1108 may include identifying the orientation of the UE via a set of three rotation angles (e.g., a roll, pitch, and yaw) associated with a corresponding set of three axes of rotation. The plurality of frequencies, in some aspects, may include two frequencies, and identifying the orientation of the UE comprises identifying the orientation of the UE via a set of two rotation angles associated with a corresponding set of two axes of rotation. In some aspects, the plurality of frequencies may include two frequencies, and identifying the orientation of the UE at 1108 may include identifying the orientation of the UE via a set of three rotation angles associated with a corresponding set of three axes of rotation based on an expected orientation of the UE during use. The plurality of frequencies, in some aspects, may include two frequencies, and identifying the orientation of the UE at 1108 may include identifying a forward direction associated with UE via a set of one or more rotation angles associated with a corresponding set of one or more axes of rotation based on an expected orientation of the UE during use. For example, referring to FIGS. 8, 9A, and 9B, the UE 804 may determine and/or identify, at 812, a location and/or orientation (or attitude) of the UE 804, the drone 910, or the UE 960.

At 1114, the UE may output an indication of the location and the orientation of the UE. The indication of the location and the orientation, in some aspects, may be output for at least one of an application or a network node. In some aspects, to output the indication at 1114, the UE may, at 1115, transmit, to at least one of the application or the network node, the indication of the location and the orientation of the UE. For example, 1114 and/or 1115 may be performed by application processor(s) 1206, cellular baseband processor(s) 1224, transceiver(s) 1222, antenna(s) 1280, and/or GAAD component 198 of FIG. 12. In some aspects, the application may be a navigation application that uses the orientation information. The indication of the location and the orientation of the UE, in some aspects, may be output, or be provided to, local applications operating on the UE. For example, referring to FIG. 8, the UE 804 may transmit indication 814 of the location and/or orientation of the UE 804 as determined and/or identified at 812.

Figure 12:
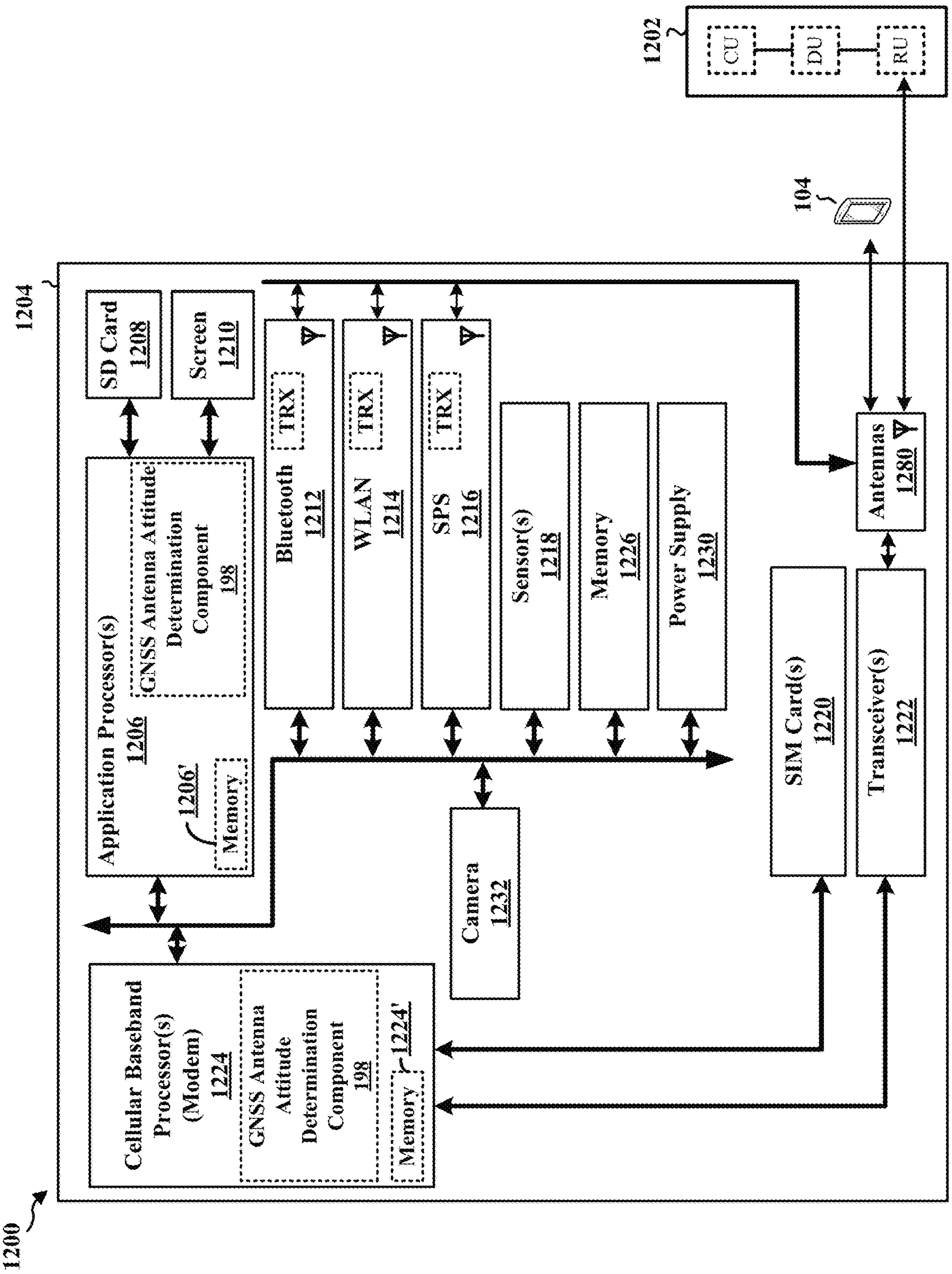
FIG. 12 is a diagram illustrating an example of a hardware implementation for an example apparatus and/or network entity.

FIG. 12 is a diagram 1200 illustrating an example of a hardware implementation for an apparatus 1204. The apparatus 1204 may be a UE, a component of a UE, or may implement UE functionality. In some aspects, the apparatus 1204 may include at least one cellular baseband processor 1224 (also referred to as a modem) coupled to one or more transceivers 1222 (e.g., cellular RF transceiver). The cellular baseband processor(s) 1224 may include at least one on-chip memory 1224'. In some aspects, the apparatus 1204 may further include one or more subscriber identity modules (SIM) cards 1220 and at least one application processor 1206 coupled to a secure digital (SD) card 1208 and a screen 1210. The application processor(s) 1206 may include on-chip memory 1206'. In some aspects, the apparatus 1204 may further include a Bluetooth module 1212, a WLAN module 1214, an SPS module 1216 (e.g., GNSS module), one or more sensor modules 1218 (e.g., barometric pressure sensor/altimeter; motion sensor such as inertial measurement unit (IMU), gyroscope, and/or accelerometer(s); light detection and ranging (LIDAR), radio assisted detection and ranging (RADAR), sound navigation and ranging (SONAR), magnetometer, audio and/or other technologies used for positioning), additional memory modules 1226, a power supply 1230, and/or a camera 1232. The Bluetooth module 1212, the WLAN module 1214, and the SPS module 1216 may include an on-chip transceiver (TRX) (or in some cases, just a receiver (RX)). The Bluetooth module 1212, the WLAN module 1214, and the SPS module 1216 may include their own dedicated antennas and/or utilize one or more antennas 1280 for communication. The cellular baseband processor(s) 1224 communicates through the transceiver(s) 1222 via the one or more antennas 1280 with the UE 104 and/or with an RU associated with a network entity 1202. The cellular baseband processor(s) 1224 and the application processor(s) 1206 may each include a computer-readable medium/memory 1224', 1206', respectively. The additional memory modules 1226 may also be considered a computer-readable medium/memory. Each computer-readable medium/memory 1224', 1206', 1226 may be non-transitory. The cellular baseband processor(s) 1224 and the application processor(s) 1206 are each responsible for general processing, including the execution of software stored on the computer-readable medium/memory. The software, when executed by the cellular baseband processor(s) 1224/application processor(s) 1206, causes the cellular baseband processor(s) 1224/application processor(s) 1206 to perform the various functions described supra. The computer-readable medium/memory may also be used for storing data that is manipulated by the cellular baseband processor(s) 1224/application processor(s) 1206 when executing software. The cellular baseband processor(s) 1224/application processor(s) 1206 may be a component of the UE 350 and may include the at least one memory 360 and/or at least one of the TX processor 368, the RX processor 356, and the controller/processor 359. In one configuration, the apparatus 1204 may be at least one processor chip (modem and/or application) and include just the cellular baseband processor(s) 1224 and/or the application processor(s) 1206, and in another configuration, the apparatus 1204 may be the entire UE (e.g., see UE 350 of FIG. 3) and include the additional modules of the apparatus 1204.

As discussed supra, the GAAD component 198 may be configured to obtain APC information for a plurality of frequencies associated with an antenna of the wireless device and measure a set of PS at each of the plurality of frequencies via the antenna. The apparatus may further be configured to identify a location and an orientation of the wireless device based on the APC information and the set of PS, and output an indication of the location and the orientation of the wireless device. The GAAD component 198 may be within the cellular baseband processor(s) 1224, the application processor(s) 1206, or both the cellular baseband processor(s) 1224 and the application processor(s) 1206. The GAAD component 198 may be one or more hardware components specifically configured to carry out the stated processes/algorithm, implemented by one or more processors configured to perform the stated processes/algorithm, stored within a computer-readable medium for implementation by one or more processors, or some combination thereof. When multiple processors are implemented, the multiple processors may perform the stated processes/algorithm individually or in combination. As shown, the apparatus 1204 may include a variety of components configured for various functions. In one configuration, the apparatus 1204, and in particular the cellular baseband processor(s) 1224 and/or the application processor(s) 1206, may include means for obtaining APC information for a plurality of frequencies associated with an antenna of the wireless device. The apparatus 1204, and in particular the cellular baseband processor(s) 1224 and/or the application processor(s) 1206, in some aspects, may include means for measuring a set of PS at each of the plurality of frequencies via the antenna. The apparatus 1204, and in particular the cellular baseband processor(s) 1224 and/or the application processor(s) 1206, in some aspects, may include means for identifying a location and an orientation of the wireless device based on the APC information and the set of PS. The apparatus 1204, and in particular the cellular baseband processor(s) 1224 and/or the application processor(s) 1206, in some aspects, may include means for outputting an indication of the location and the orientation of the wireless device. The apparatus 1204, and in particular the cellular baseband processor(s) 1224 and/or the application processor(s) 1206, in some aspects, may include means for determining a location of an APC associated with each of the plurality of frequencies. The apparatus 1204, and in particular the cellular baseband processor(s) 1224 and/or the application processor(s) 1206, in some aspects, may include means for determining, based on a set of relative locations of the APC associated with each of the plurality of frequencies, the orientation of the wireless device. The apparatus 1204, and in particular the cellular baseband processor(s) 1224 and/or the application processor(s) 1206, in some aspects, may include means for determining a range of an APC associated with each of the plurality of frequencies. The apparatus 1204, and in particular the cellular baseband processor(s) 1224 and/or the application processor(s) 1206, in some aspects, may include means for determining a first location of the APC associated with a first frequency of the plurality of frequencies. The apparatus 1204, and in particular the cellular baseband processor(s) 1224 and/or the application processor(s) 1206, in some aspects, may include means for determining, based on the location of the APC associated with the first frequency and the ranges of the APC associated with each of the plurality of frequencies, the orientation of the wireless device. The apparatus 1204, and in particular the cellular baseband processor(s) 1224 and/or the application processor(s) 1206, in some aspects, may include means for transmitting, to at least one of an application or a network node, the indication of the location and the orientation of the wireless device. The apparatus 1204, and in particular the cellular baseband processor(s) 1224 and/or the application processor(s) 1206, in some aspects, may include means for transmitting, to a network device, a capability indication of a capability to identify the location and the orientation of the wireless device based on the APC information. The means may be the GAAD component 198 of the apparatus 1204 configured to perform the functions recited by the means. As described supra, the apparatus 1204 may include the TX processor 368, the RX processor 356, and the controller/processor 359. As such, in one configuration, the means may be the TX processor 368, the RX processor 356, and/or the controller/processor 359 configured to perform the functions recited by the means or as described in relation to FIGS. 10 and 11.

In some aspects, it may be important to determine a UE (e.g., smartphone or vehicle) attitude in modern location systems. In a static start scenario, heading estimation is still a problem in many existing market location products. In modern multi-frequency GNSS receiver systems, especially mobile platform, the antenna PCO between multiple frequency bands may not be negligible in precise positioning applications. In one embodiment, aspects presented herein may use multiple band phase centers (e.g., L1, L2, L5) in a multi-frequency GNSS antenna to determine/estimate the device attitude. First, aspects presented herein may survey the phase center for each frequency band (e.g., L1, L2, L5). Then, aspects presented herein may estimate state (position & velocity) separately for each frequency bands using corresponding GNSS measurement. Aspects presented herein may then compute the device attitude by a rotation matrix into ENU frame.

Various aspects relate generally to attitude determination at a wireless device and more particularly attitude determination at a wireless device using a multi-frequency GNSS antenna. Some aspects more specifically relate to PCO-based attitude determination. In some examples, a wireless device may be configured to obtain APC (or PCO) information for a plurality of frequencies associated with an antenna (e.g., an antenna assembly or antenna structure) of the wireless device and measure a set of PS at each of the plurality of frequencies via the antenna. The wireless device, in some examples, may further be configured to identify a location and an orientation of the wireless device based on the APC information and the set of PS, and output (e.g., for at least one of an application or a network node) an indication of the location and the orientation of the wireless device.

Particular aspects of the subject matter described in this disclosure can be implemented to realize one or more of the following potential advantages. In some examples, by using PCO information, the described techniques can be used to provide a more accurate attitude (e.g., a heading or orientation) determination. Furthermore, in some aspects, by using the PCO information, the attitude determination may be made based on measurements associated with a single multi-frequency antenna.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not limited to the aspects described herein, but are to be accorded the full scope consistent with the language claims. Reference to an element in the singular does not mean "one and only one" unless specifically so stated, but rather "one or more." Terms such as "if," "when," and "while" do not imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. Sets should be interpreted as a set of elements where the elements number one or more. Accordingly, for a set of X, X would include one or more elements. When at least one processor is configured to perform a set of functions, the at least one processor, individually or in any combination, is configured to perform the set of functions. Accordingly, each processor of the at least one processor may be configured to perform a particular subset of the set of functions, where the subset is the full set, a proper subset of the set, or an empty subset of the set. A processor may be referred to as processor circuitry. A memory/memory module may be referred to as memory circuitry. If a first apparatus receives data from or transmits data to a second apparatus, the data may be received/transmitted directly between the first and second apparatuses, or indirectly between the first and second apparatuses through a set of apparatuses. A device configured to "output" data, such as a transmission, signal, or message, may transmit the data, for example with a transceiver, or may send the data to a device that transmits the data. A device configured to "obtain" data, such as a transmission, signal, or message, may receive, for example with a transceiver, or may obtain the data from a device that receives the data. Information stored in a memory includes instructions and/or data. All structural and functional equivalents to the elements of the various aspects described throughout this disclosure that are known or later come to be known to those of ordinary skill in the art are expressly incorporated herein by reference and are encompassed by the claims. Moreover, nothing disclosed herein is dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

As used herein, the phrase "based on" shall not be construed as a reference to a closed set of information, one or more conditions, one or more factors, or the like. In other words, the phrase "based on A" (where "A" may be information, a condition, a factor, or the like) shall be construed as "based at least on A" unless specifically recited differently.

The following aspects are illustrative only and may be combined with other aspects or teachings described herein, without limitation.

Aspect 1 is a method of wireless communication at a wireless device, comprising: obtaining antenna phase center (APC) information for a plurality of frequencies associated with an antenna of the wireless device; measuring a set of positioning signals (PS) at each of the plurality of frequencies via the antenna; identifying a location and an orientation of the wireless device based on the APC information and the set of PS; and outputting an indication of the location and the orientation of the wireless device.

Aspect 2 is the method of aspect 1, wherein the APC information comprises phase center offset (PCO) information relative to a point associated with the wireless device in a first orientation.

Aspect 3 is the method of aspect 2, wherein the PCO information is based on a set of prior measurements of a second set of PS at each of the plurality of frequencies for each of one or more other wireless devices corresponding to the wireless device, and wherein a position and an orientation of the one or more other wireless devices is known and the PCO information is based on a location associated with the measurements of the second set of PS at each of the plurality of frequencies for each of the one or more other wireless devices corresponding to the wireless device.

Aspect 4 is the method of any of aspects 1 to 3, wherein the APC information comprises a rotation matrix based on a set of relative positions of an APC for each of the plurality of frequencies.

Aspect 5 is the method of any of aspects 1 to 4, wherein identifying the location and the orientation of the wireless device comprises: determining a first location of an APC associated with each of the plurality of frequencies; and determining, based on a set of relative locations of the APC associated with each of the plurality of frequencies, the orientation of the wireless device.

Aspect 6 is the method of any of aspects 1 to 4, wherein identifying the location and the orientation of the wireless device comprises: determining a range of an APC associated with each of the plurality of frequencies; determining a first location of the APC associated with a first frequency of the plurality of frequencies; and determining, based on the location of the APC associated with the first frequency and the ranges of the APC associated with each of the plurality of frequencies, the orientation of the wireless device.

Aspect 7 is the method of any of aspects 1 to 6, wherein the plurality of frequencies comprises three frequencies, and wherein identifying the orientation of the wireless device comprises identifying the orientation of the wireless device via a set of three rotation angles associated with a corresponding set of three axes of rotation.

Aspect 8 is the method of any of aspects 1 to 6, wherein the plurality of frequencies comprises two frequencies, and wherein identifying the orientation of the wireless device comprises identifying the orientation of the wireless device via a set of two rotation angles associated with a corresponding set of two axes of rotation.

Aspect 9 is the method of any of aspects 1 to 6, wherein the plurality of frequencies comprises two frequencies, and wherein identifying the orientation of the wireless device comprises identifying the orientation of the wireless device via a set of three rotation angles associated with a corresponding set of three axes of rotation based on an expected orientation of the wireless device during use.

Aspect 10 is the method of any of aspects 1 to 9, wherein the antenna comprises a first antenna and each of the plurality of frequencies is associated with the first antenna of the wireless device.

Aspect 11 is the method of any of aspects 1 to 9, wherein the set of PS comprises at least one of positioning signals associated with a global navigation satellite system.

Aspect 12 is the method of any of aspects 1 to 11, wherein outputting the indication of the location and the orientation of the wireless device comprises: transmitting, to at least one of an application or a network node, the indication of the location and the orientation of the wireless device.

Aspect 13 is the method of any of aspects 1 to 12 further comprising: transmitting, to a network device, a capability indication of a capability to identify the location and the orientation of the wireless device based on the APC information, wherein obtaining the APC information comprises receiving the APC information from the network device in response to the transmitting the indication.

Aspect 14 is the method of aspect 13, wherein the capability indication further comprises an identifier of the wireless device associated with the APC information and receiving the APC information is based on the identifier.

Aspect 15 is an apparatus for wireless communication at a device including a memory and at least one processor coupled to the memory and, based at least in part on information stored in the memory, the at least one processor is configured to implement any of aspects 1 to 14.

Aspect 16 is the apparatus of aspect 15, further including a transceiver or an antenna coupled to the at least one processor.

Aspect 17 is an apparatus for wireless communication at a device including means for implementing any of aspects 1 to 14.

Aspect 18 is a computer-readable medium (e.g., a non-transitory computer-readable medium) storing computer executable code, where the code when executed by a processor causes the processor to implement any of aspects 1 to 14.

What is claimed is:

1. An apparatus for wireless communication at a wireless device, comprising:
- at least one memory; and
- at least one processor coupled to the at least one memory and the at least one processor, individually or in any combination, is configured to:
  - obtain antenna phase center (APC) information for a plurality of frequencies associated with an antenna of the wireless device;
  - measure a set of positioning signals (PS) at each of the plurality of frequencies via the antenna;
  - identify a location and an orientation of the wireless device based on the APC information and the set of PS; and
  - output an indication of the location and the orientation of the wireless device,
  - wherein, to identify the location and the orientation of the wireless device, the at least one processor, individually or in any combination, is configured to:
    - determine a range of an APC associated with each of the plurality of frequencies;
    - determine a first location of the APC associated with a first frequency of the plurality of frequencies; and
    - determine, based on the location of the APC associated with the first frequency and the ranges of the APC associated with each of the plurality of frequencies, the orientation of the wireless device.

2. The apparatus of claim 1, wherein the APC information comprises phase center offset (PCO) information relative to a point associated with the wireless device in a first orientation.

3. The apparatus of claim 2, wherein the PCO information is based on a set of prior measurements of a second set of PS at each of the plurality of frequencies for each of one or more other wireless devices corresponding to the wireless device, and wherein a position and an orientation of the one or more other wireless devices is known and the PCO information is based on a location associated with the measurements of the second set of PS at each of the plurality of frequencies for each of the one or more other wireless devices corresponding to the wireless device.

4. The apparatus of claim 1, wherein the APC information comprises a rotation matrix based on a set of relative positions of an APC for each of the plurality of frequencies.

5. The apparatus of claim 1, wherein the plurality of frequencies comprises three frequencies, and wherein to identify the orientation of the wireless device the at least one processor, individually or in any combination, is configured to identify the orientation of the wireless device via a set of three rotation angles associated with a corresponding set of three axes of rotation.

6. The apparatus of claim 1, wherein the plurality of frequencies comprises two frequencies, and wherein to identify the orientation of the wireless device the at least one processor, individually or in any combination, is configured to identify the orientation of the wireless device via a set of two rotation angles associated with a corresponding set of two axes of rotation.

7. The apparatus of claim 1, wherein the plurality of frequencies comprises two frequencies, and wherein to identify the orientation of the wireless device the at least one processor, individually or in any combination, is configured to identify the orientation of the wireless device via a set of three rotation angles associated with a corresponding set of three axes of rotation based on an expected orientation of the wireless device during use.

8. The apparatus of claim 1, wherein the antenna comprises a first antenna and each of the plurality of frequencies is associated with the first antenna of the wireless device.

9. The apparatus of claim 1, wherein the set of PS comprises at least one of positioning signals associated with a global navigation satellite system.

10. The apparatus of claim 1, wherein, to output the indication of the location and the orientation of the wireless device, the at least one processor, individually or in any combination, is configured to:

transmit, to at least one of an application or a network node, the indication of the location and the orientation of the wireless device.

11. The apparatus of claim 1 further comprising a transceiver coupled to the at least one processor, wherein the at least one processor, individually or in any combination, is further configured to:

transmit, to a network device via the transceiver, a capability indication of a capability to identify the location and the orientation of the wireless device based on the APC information, wherein to obtain the APC information, the at least one processor, individually or in any combination, is further configured to receive the APC information from the network device in response to the transmitting the indication.

12. The apparatus of claim 11, wherein the capability indication further comprises an identifier of the wireless device associated with the APC information, and wherein the at least one processor, individually or in any combination, is configured to receive the APC information is based on the identifier.

13. A method of wireless communication at a wireless device, comprising:

obtaining antenna phase center (APC) information for a plurality of frequencies associated with an antenna of the wireless device;

measuring a set of positioning signals (PS) at each of the plurality of frequencies via the antenna;

identifying a location and an orientation of the wireless device based on the APC information and the set of PS; and outputting an indication of the location and the orientation of the wireless device, wherein identifying the location and the orientation of the wireless device comprises:

determining a range of an APC associated with each of the plurality of frequencies;

determining a first location of the APC associated with a first frequency of the plurality of frequencies; and determining, based on the location of the APC associated with the first frequency and the ranges of the APC associated with each of the plurality of frequencies, the orientation of the wireless device.

14. The method of claim 13, wherein the APC information comprises phase center offset (PCO) information relative to a point associated with the wireless device in a first orientation.

15. The method of claim 14, wherein the PCO information is based on a set of prior measurements of a second set of PS at each of the plurality of frequencies for each of one or more other wireless devices corresponding to the wireless device, and wherein a position and an orientation of the one or more other wireless devices is known and the PCO information is based on a location associated with the measurements of the second set of PS at each of the plurality of frequencies for each of the one or more other wireless devices corresponding to the wireless device.

16. The method of claim 13, wherein the APC information comprises a rotation matrix based on a set of relative positions of an APC for each of the plurality of frequencies.

17. The method of claim 13, wherein the plurality of frequencies comprises three frequencies, and wherein identifying the orientation of the wireless device comprises identifying the orientation of the wireless device via a set of three rotation angles associated with a corresponding set of three axes of rotation.

18. The method of claim 13, wherein the plurality of frequencies comprises two frequencies, and wherein identifying the orientation of the wireless device comprises identifying the orientation of the wireless device via a set of two rotation angles associated with a corresponding set of two axes of rotation.

19. The method of claim 13, wherein the plurality of frequencies comprises two frequencies, and wherein identifying the orientation of the wireless device comprises identifying the orientation of the wireless device via a set of three rotation angles associated with a corresponding set of three axes of rotation based on an expected orientation of the wireless device during use.

20. The method of claim 13, wherein the antenna comprises a first antenna and each of the plurality of frequencies is associated with the first antenna of the wireless device.

21. The method of claim 13, wherein the set of PS comprises at least one of positioning signals associated with a global navigation satellite system.

22. The method of claim 13, wherein outputting the indication of the location and the orientation of the wireless device comprises:

transmitting, to at least one of an application or a network node, the indication of the location and the orientation of the wireless device.

23. The method of claim 13 further comprising:

transmitting, to a network device, a capability indication of a capability to identify the location and the orientation of the wireless device based on the APC information, wherein obtaining the APC information comprises receiving the APC information from the network device in response to the transmitting the indication.

24. The method of claim 23, wherein the capability indication further comprises an identifier of the wireless device associated with the APC information and receiving the APC information is based on the identifier.

25. An apparatus for wireless communication at a wireless device, comprising:

means for obtaining antenna phase center (APC) information for a plurality of frequencies associated with an antenna of the wireless device;

means for measuring a set of positioning signals (PS) at each of the plurality of frequencies via the antenna;

means for identifying a location and an orientation of the wireless device based on the APC information and the set of PS; and means for outputting an indication of the location and the orientation of the wireless device, wherein means for identifying the location and the orientation of the wireless device comprises:

means for determining a range of an APC associated with each of the plurality of frequencies;

means for determining a first location of the APC associated with a first frequency of the plurality of frequencies; and means for determining, based on the location of the APC associated with the first frequency and the ranges of the APC associated with each of the plurality of frequencies, the orientation of the wireless device.

26. A non-transitory computer-readable medium storing computer executable code at a wireless device, the code when executed by a processor causes the processor to perform one or more operations comprising:

obtaining antenna phase center (APC) information for a plurality of frequencies associated with an antenna of the wireless device;

measuring a set of positioning signals (PS) at each of the plurality of frequencies via the antenna;

identifying a location and an orientation of the wireless device based on the APC information and the set of PS; and outputting an indication of the location and the orientation of the wireless device, wherein identifying the location and the orientation of the wireless device comprises:

determining a range of an APC associated with each of the plurality of frequencies;

determining a first location of the APC associated with a first frequency of the plurality of frequencies; and determining, based on the location of the APC associated with the first frequency and the ranges of the APC associated with each of the plurality of frequencies, the orientation of the wireless device.

* * * * *